(12) United States Patent
Shibuya et al.

(10) Patent No.: US 11,848,244 B2
(45) Date of Patent: Dec. 19, 2023

(54) LEADED WAFER CHIP SCALE PACKAGES

(71) Applicant: TEXAS INSTRUMENTS INCORPORATED, Dallas, TX (US)

(72) Inventors: Makoto Shibuya, Tokyo (JP); Masamitsu Matsuura, Beppu (JP); Kengo Aoya, Beppu (JP)

(73) Assignee: Texas Instruments Incorporated, Dallas, TX (US)

( * ) Notice: Subject to any disclaimer, the term of this patent is extended or adjusted under 35 U.S.C. 154(b) by 132 days.

(21) Appl. No.: 17/491,394

(22) Filed: Sep. 30, 2021

(65) Prior Publication Data

US 2023/0095630 A1    Mar. 30, 2023

(51) Int. Cl.
*H01L 23/31* (2006.01)
*H01L 23/528* (2006.01)
*H01L 23/00* (2006.01)

(52) U.S. Cl.
CPC ........ *H01L 23/3114* (2013.01); *H01L 23/528* (2013.01); *H01L 24/08* (2013.01); *H01L 24/96* (2013.01); *H01L 2224/08245* (2013.01); *H01L 2224/08501* (2013.01)

(58) Field of Classification Search
CPC ... H01L 23/3114; H01L 23/528; H01L 24/08; H01L 24/96
See application file for complete search history.

(56) References Cited

U.S. PATENT DOCUMENTS

| 5,075,258 | A | * | 12/1991 | Carney | ............... H01L 21/4821 148/269 |
| 9,165,873 | B1 | * | 10/2015 | Howard | ............ H01L 23/49541 |
| 9,281,258 | B1 | * | 3/2016 | Fon | ......... H01L 24/97 |
| 11,322,433 | B2 | * | 5/2022 | Tuncer | ............. H01L 23/49861 |
| 2004/0026773 | A1 | * | 2/2004 | Koon | ............... H01L 23/49551 257/E23.047 |
| 2005/0230808 | A1 | * | 10/2005 | Yu | ..................... H01L 23/49555 257/693 |
| 2009/0039484 | A1 | * | 2/2009 | Mahler | ................... H01L 24/86 257/676 |
| 2013/0307141 | A1 | * | 11/2013 | Odegard | ............... H01L 23/295 257/737 |
| 2014/0151794 | A1 | * | 6/2014 | Lotfi | ................. H01L 23/49589 438/123 |
| 2014/0191381 | A1 | * | 7/2014 | Lee | ................... H01L 23/49537 257/676 |
| 2014/0361420 | A1 | * | 12/2014 | Yilmaz | ............ H01L 23/49537 257/676 |

(Continued)

*Primary Examiner* — Nathan W Ha
(74) *Attorney, Agent, or Firm* — Dawn Jos; Frank D. Cimino

(57) ABSTRACT

In examples, a wafer chip scale package (WCSP) comprises a semiconductor die including a device side having circuitry formed therein. The WCSP includes a redistribution layer (RDL) including an insulation layer abutting the device side and a metal trace coupled to the device side and abutting the insulation layer. The WCSP includes a conductive member coupled to the metal trace, the conductive member in a first vertical plane that is positioned no farther than a quarter of a horizontal width of the semiconductor die from a vertical axis extending through a center of the semiconductor die. The WCSP includes a lead coupled to the conductive member and extending horizontally past a second vertical plane defined by a perimeter of the semiconductor die.

23 Claims, 30 Drawing Sheets

(56) References Cited

U.S. PATENT DOCUMENTS

| | | | |
|---|---|---|---|
| 2016/0104666 A1* | 4/2016 | Gowda | H01L 24/73 257/774 |
| 2016/0118320 A1* | 4/2016 | Coppone | H01L 24/37 438/123 |
| 2018/0197807 A1* | 7/2018 | Haga | H01L 23/3114 |
| 2019/0006268 A1* | 1/2019 | Sugiura | H01L 23/49568 |
| 2020/0020615 A1* | 1/2020 | Castro | H01L 23/3185 |
| 2020/0176412 A1* | 6/2020 | Kessler | H01L 24/19 |
| 2020/0203243 A1* | 6/2020 | Koduri | H01L 23/49575 |
| 2020/0258825 A1* | 8/2020 | Tang | H01L 24/32 |
| 2020/0273782 A1* | 8/2020 | Quinones | H01L 23/49575 |
| 2020/0411418 A1* | 12/2020 | Tang | H01L 23/49541 |
| 2021/0013136 A1* | 1/2021 | Cho | H01L 23/49861 |
| 2021/0111106 A1* | 4/2021 | Gambino | H01L 24/92 |
| 2021/0118778 A1* | 4/2021 | Blansaer | H01L 24/48 |
| 2021/0166988 A1* | 6/2021 | Joanna Chye | H01L 24/40 |
| 2021/0202345 A1* | 7/2021 | Koduri | H01L 25/50 |
| 2021/0313258 A1* | 10/2021 | Tuncer | H01L 23/49816 |
| 2022/0028765 A1* | 1/2022 | Koduri | H01L 23/3107 |
| 2022/0093573 A1* | 3/2022 | Kessler | H01L 23/49822 |
| 2023/0078615 A1* | 3/2023 | Yamada | H01L 21/56 |

* cited by examiner

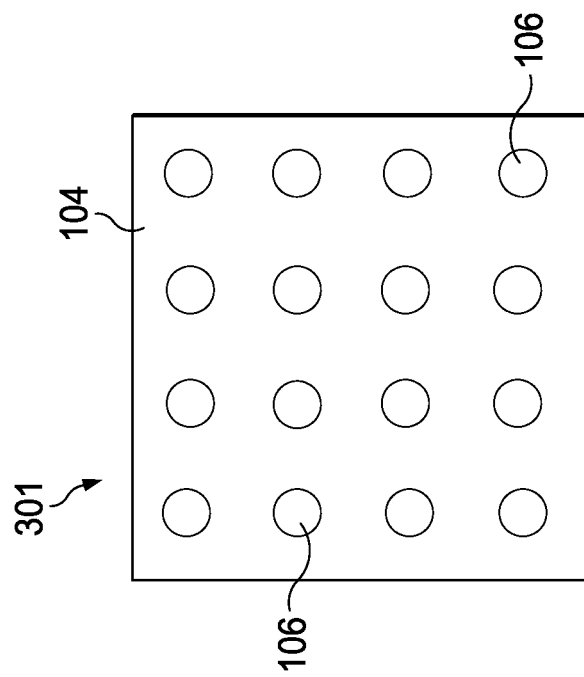
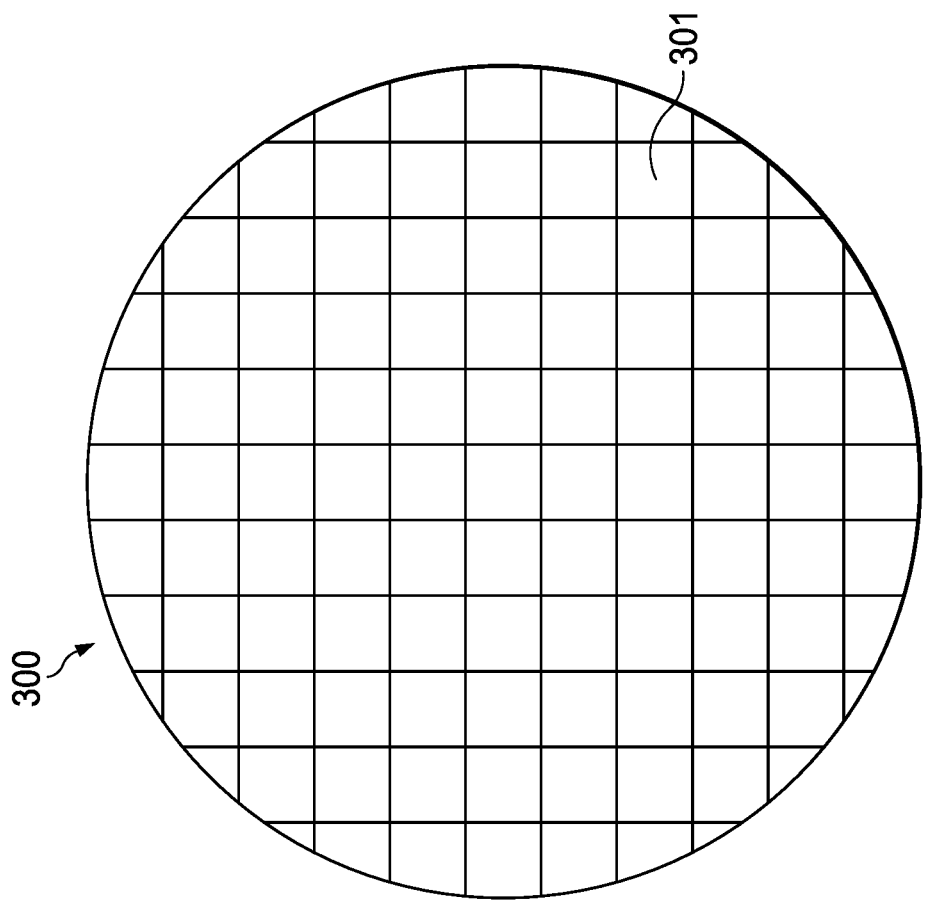

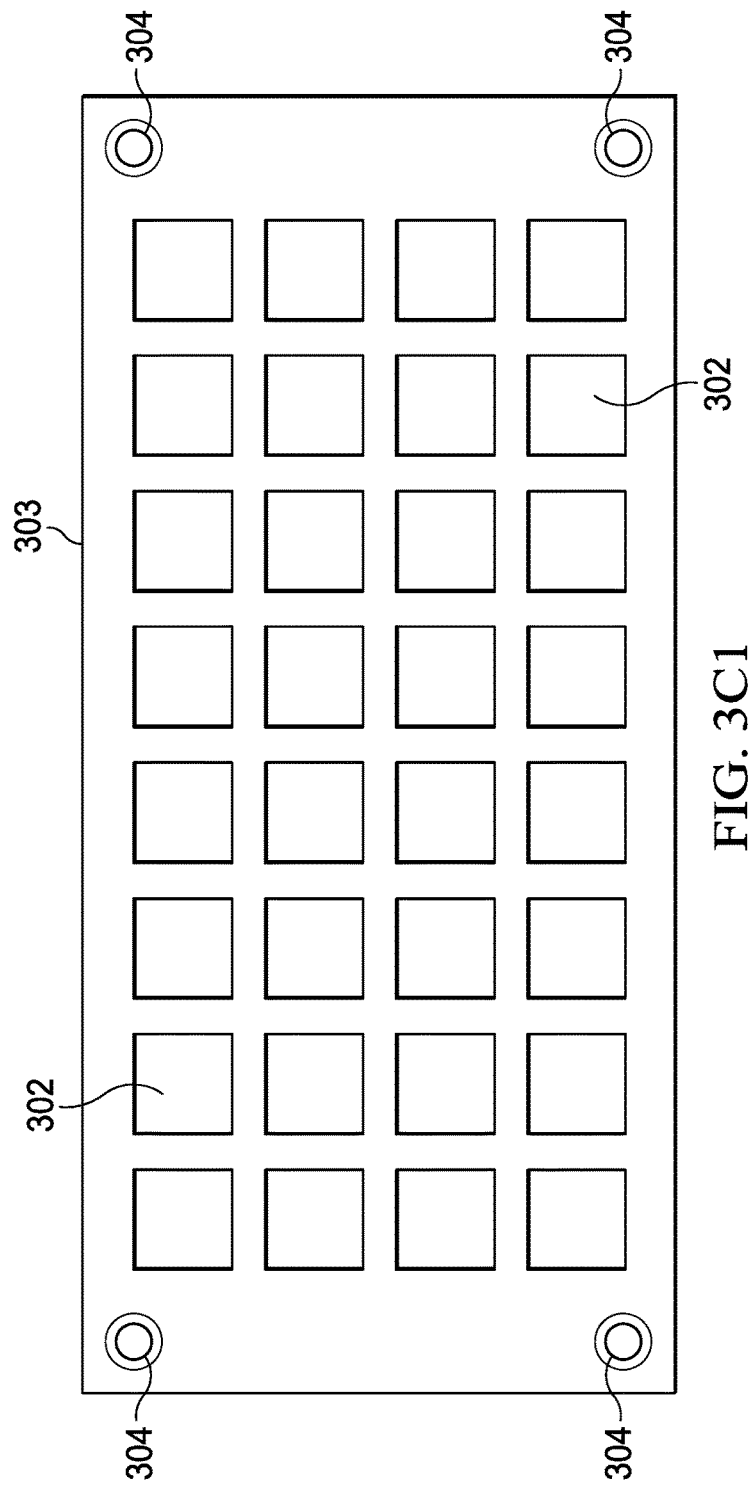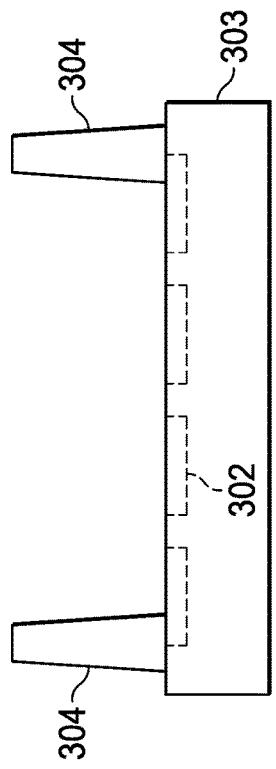

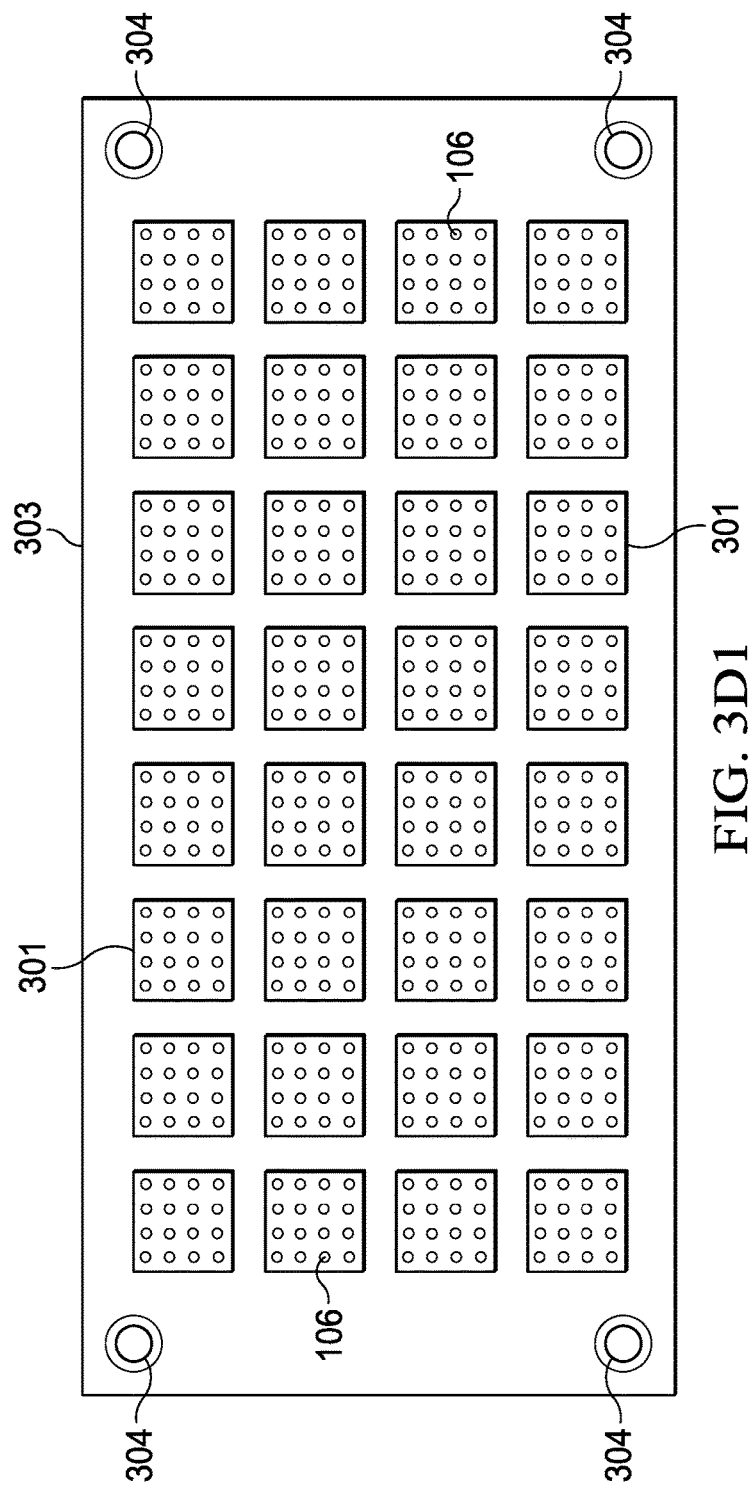
FIG. 3D1
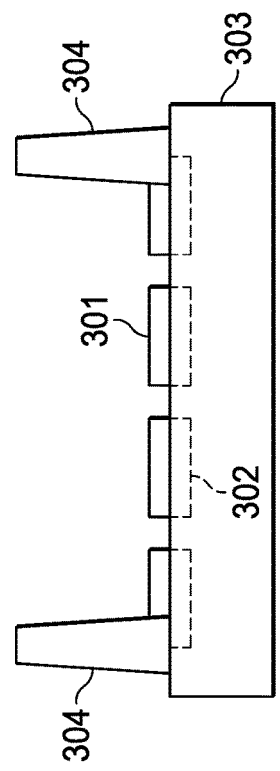
FIG. 3D2

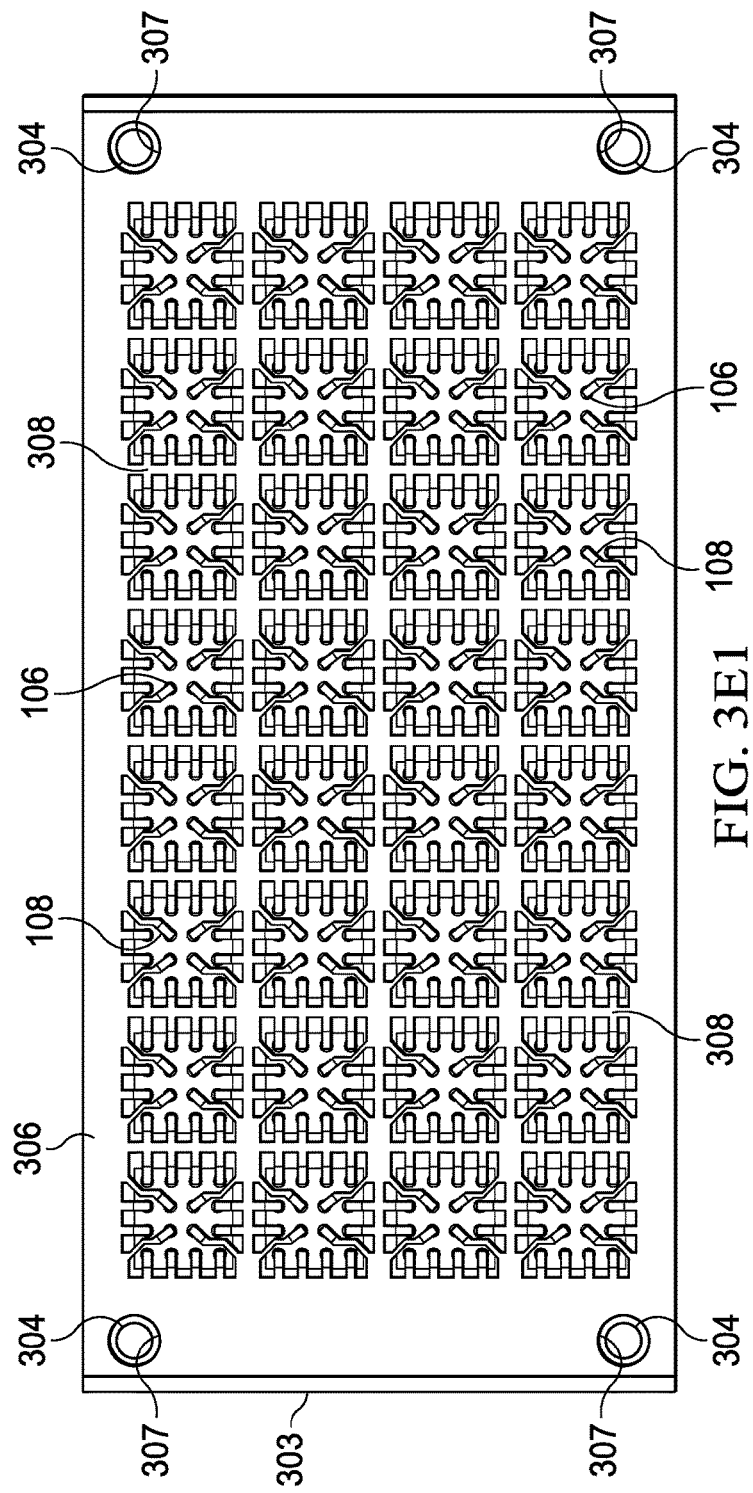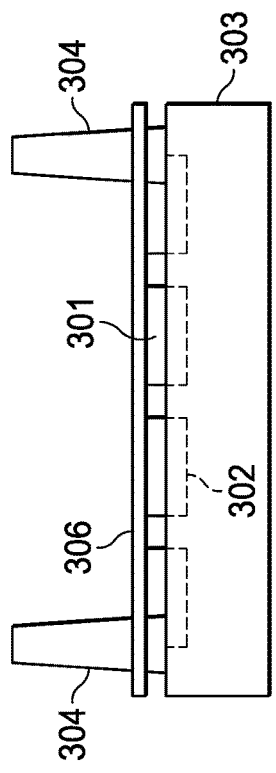
FIG. 3E1
FIG. 3E2

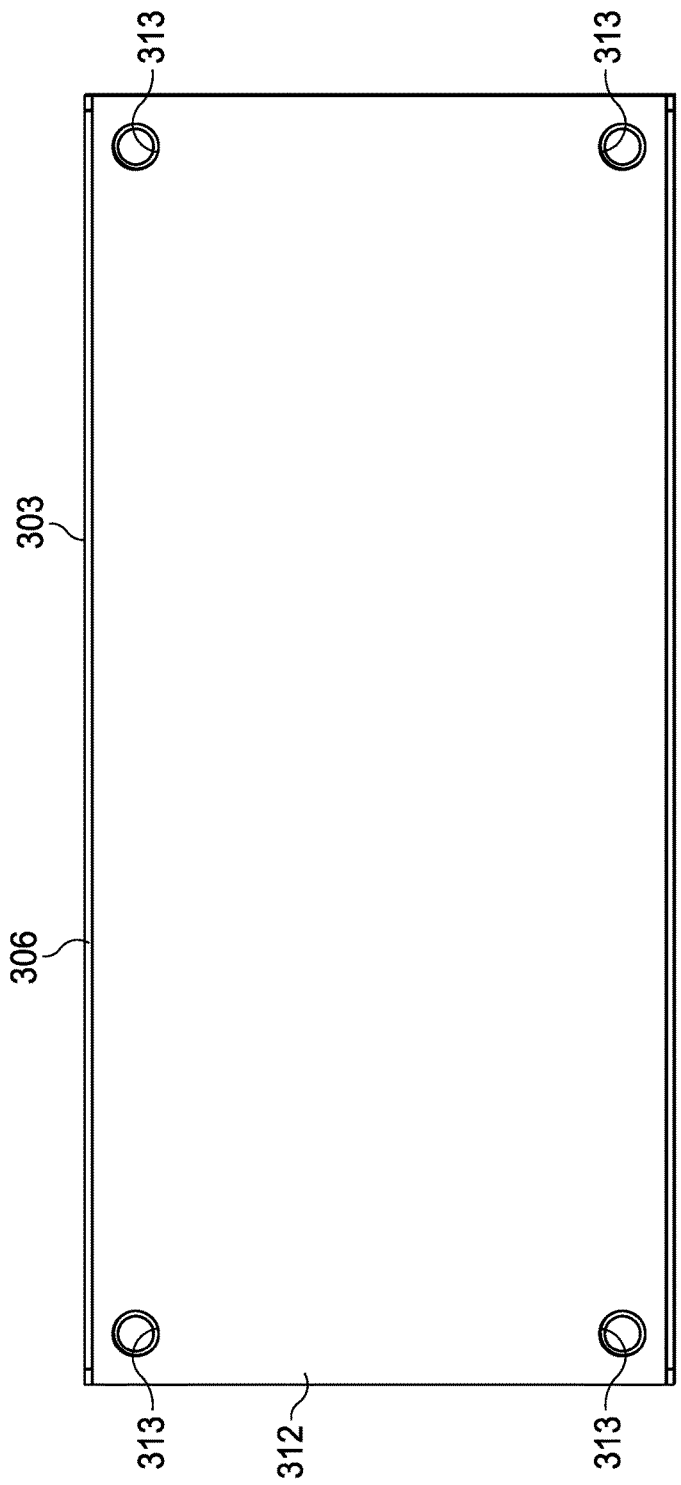
FIG. 3F1
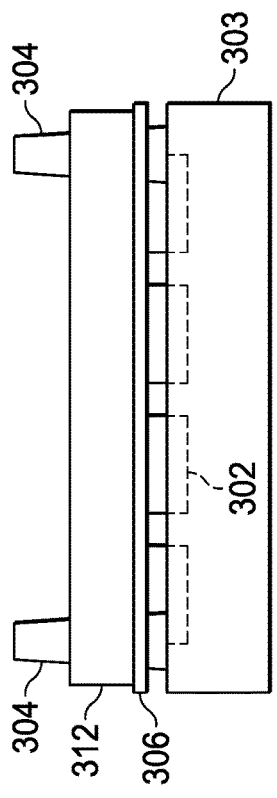
FIG. 3F2

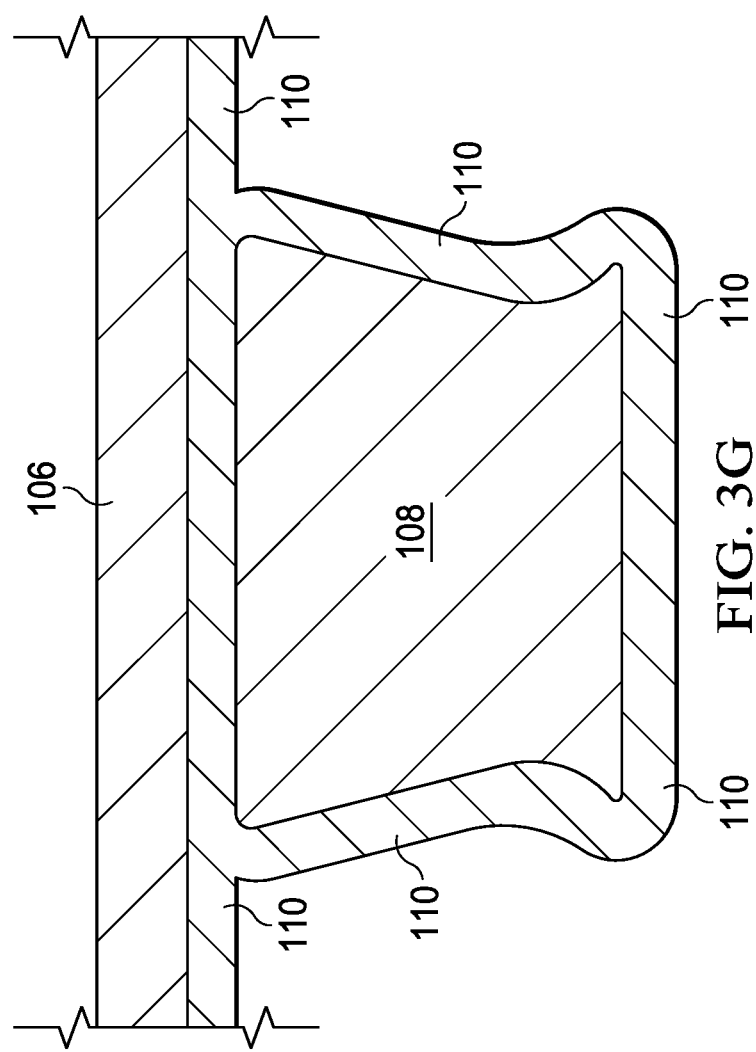

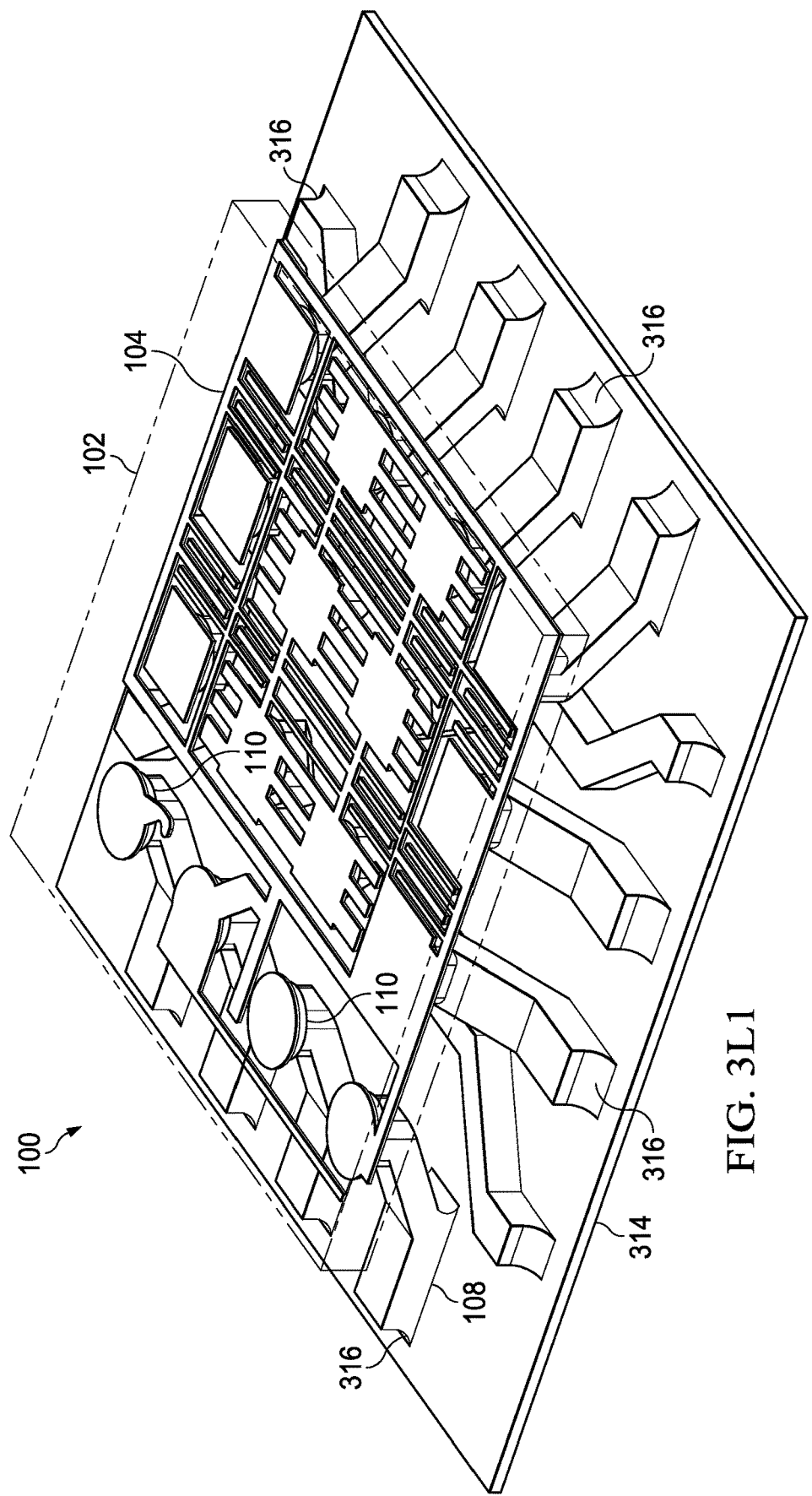
FIG. 3L1

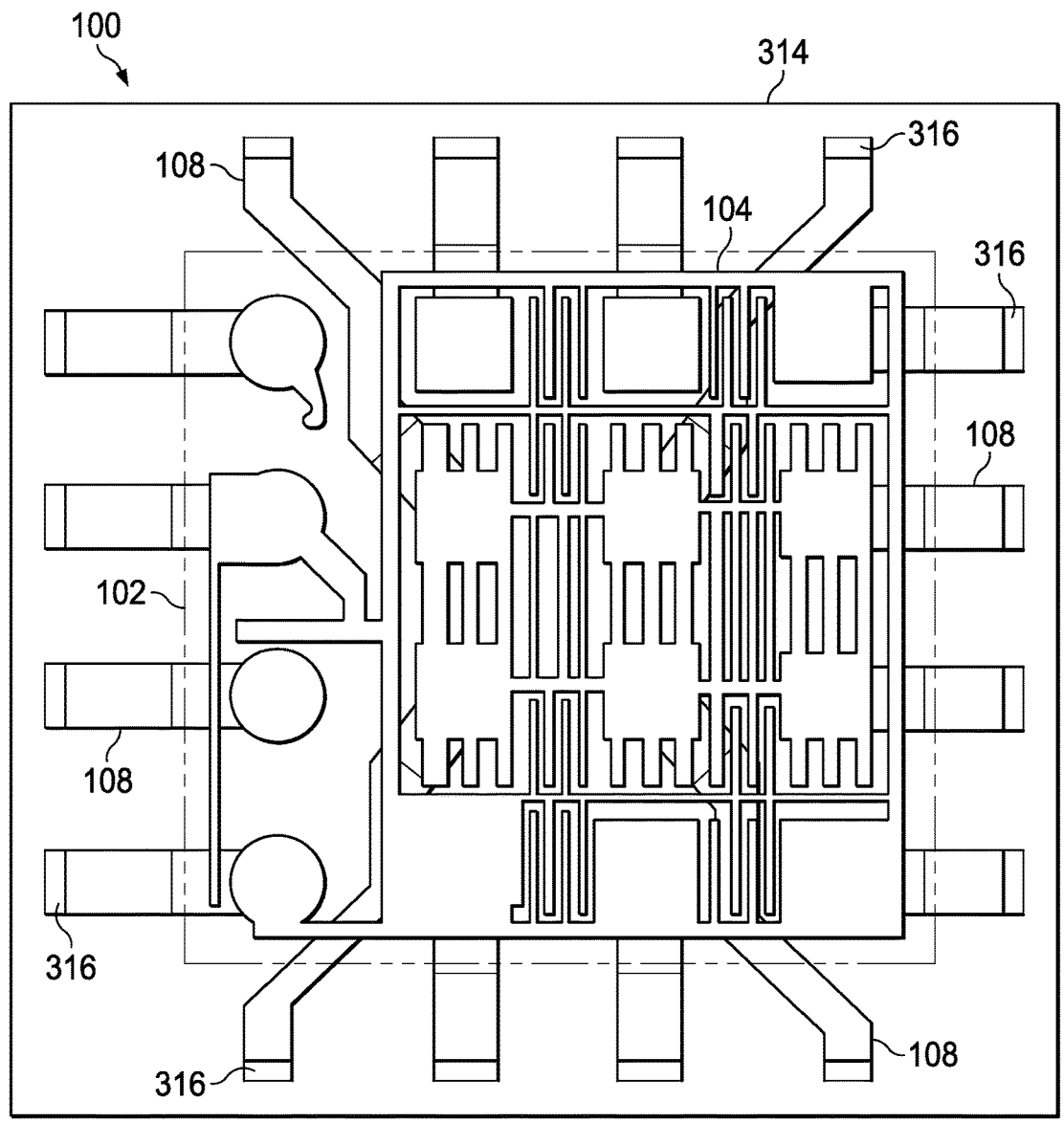
FIG. 3L2
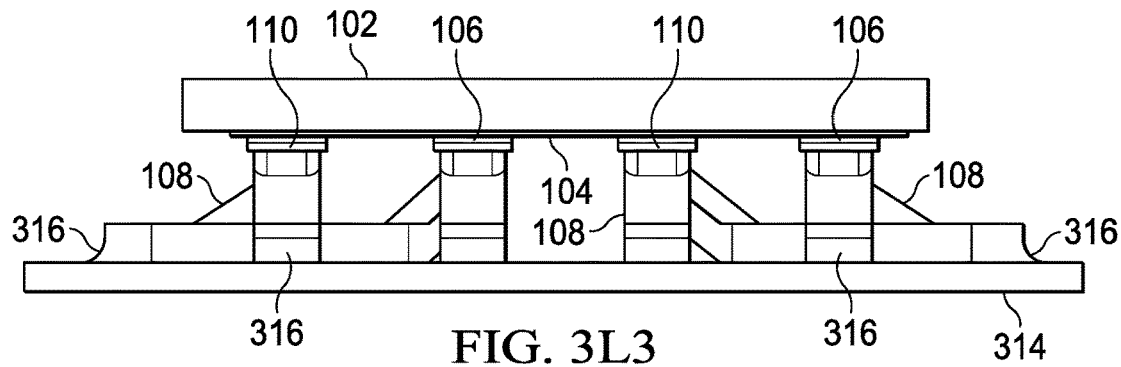
FIG. 3L3

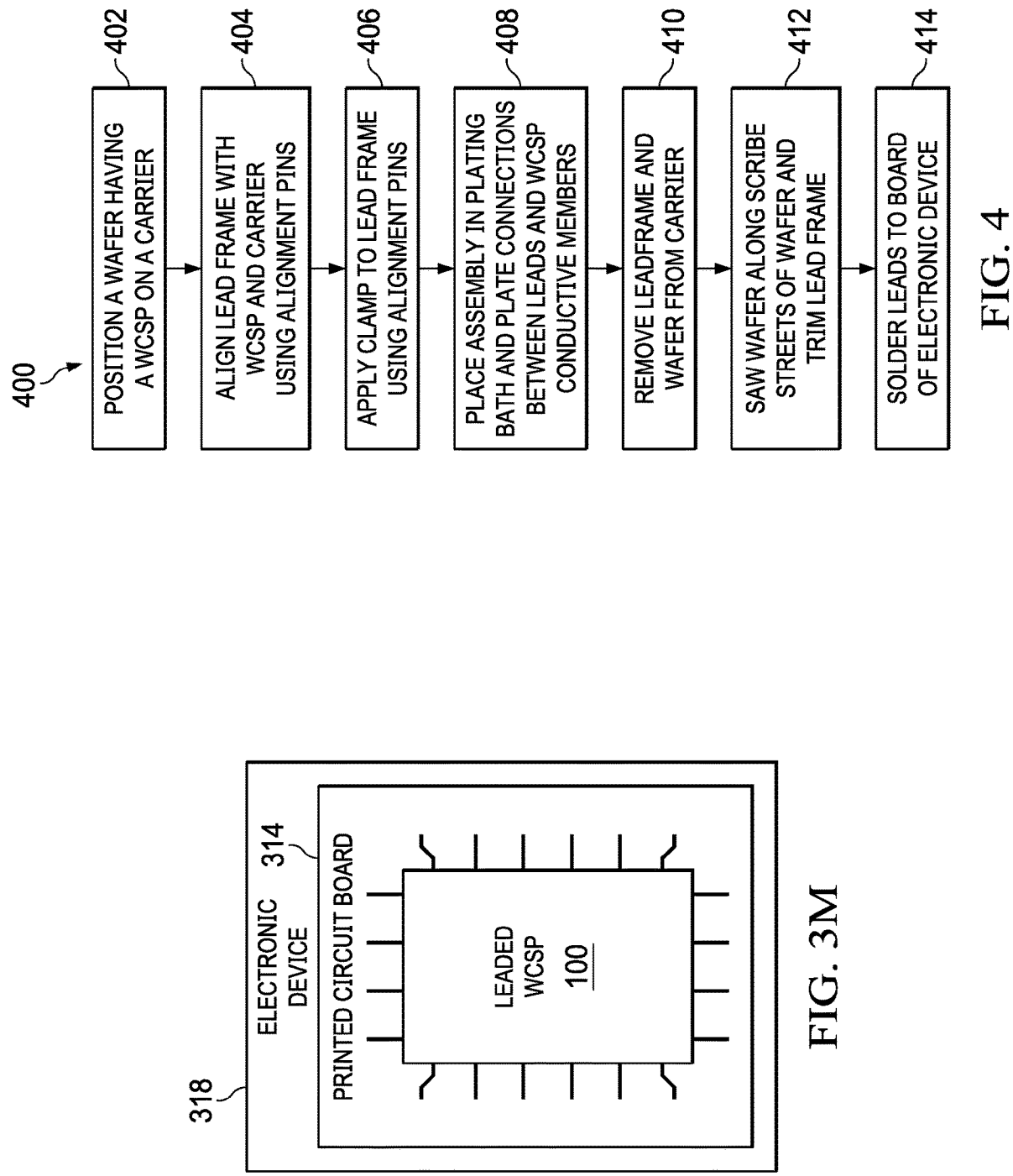

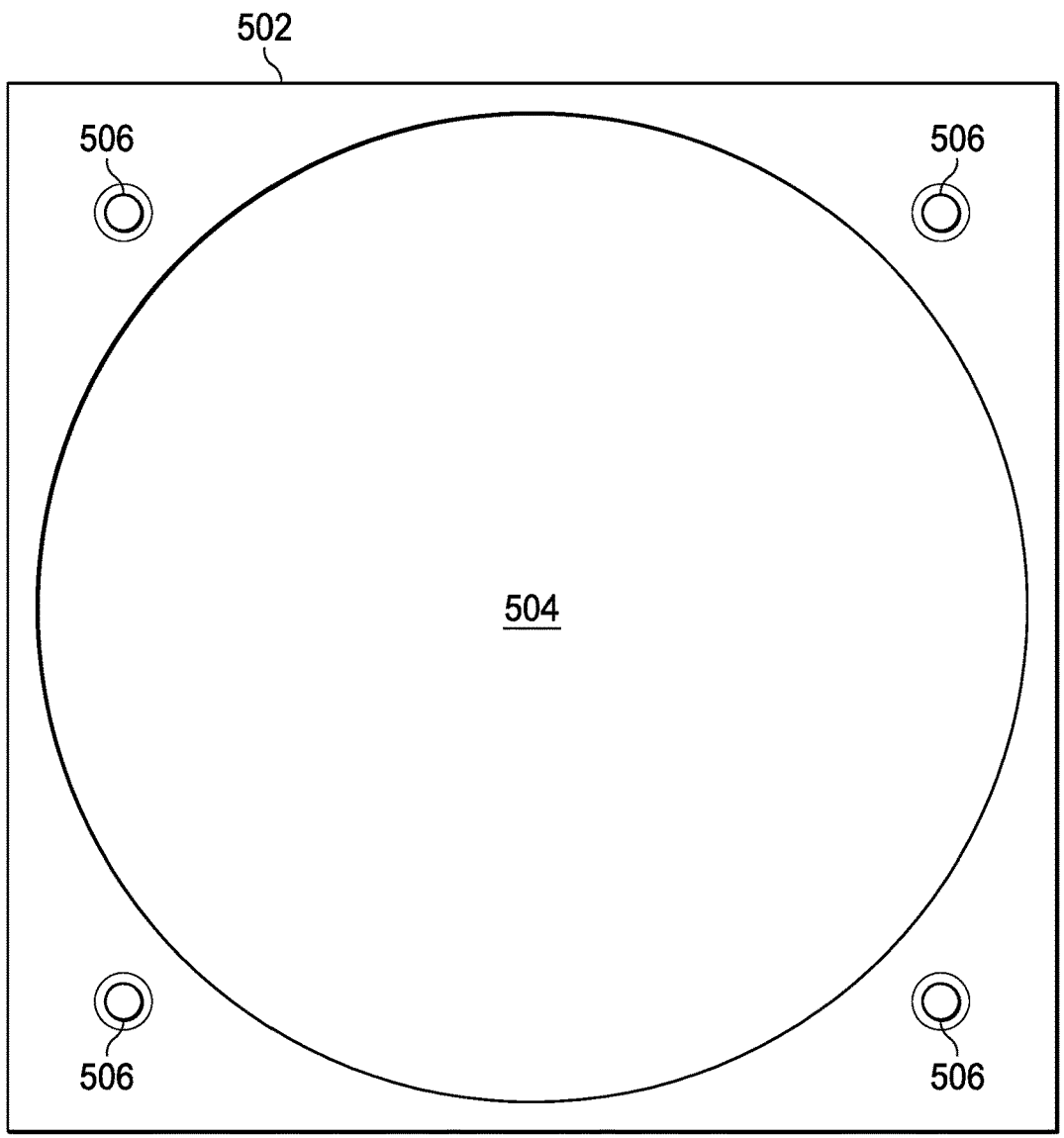
FIG. 5C1
FIG. 5C2

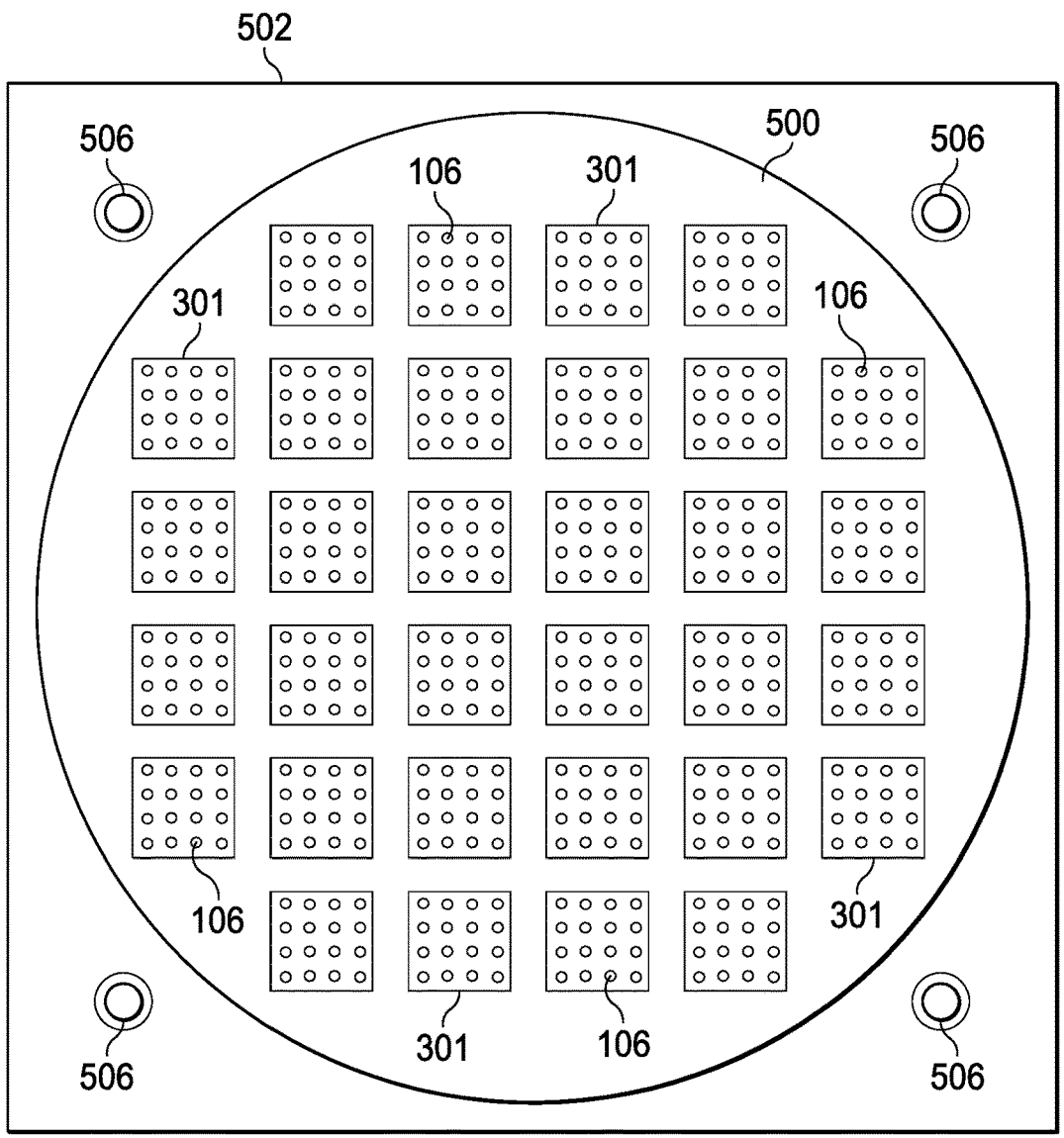
FIG. 5D1
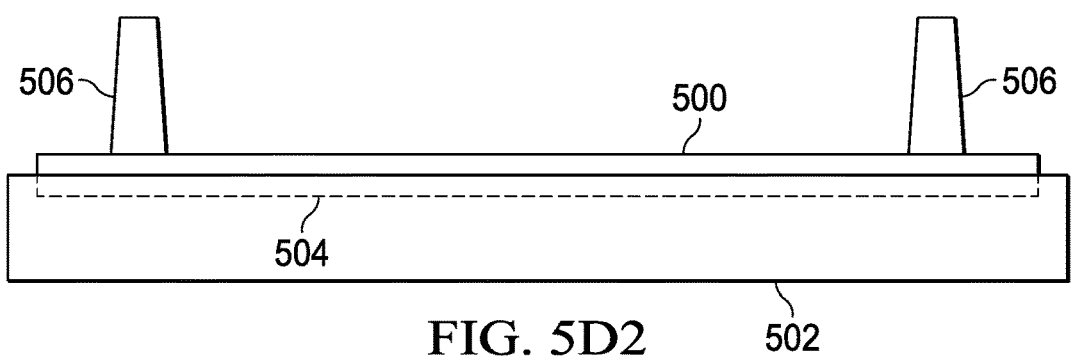
FIG. 5D2

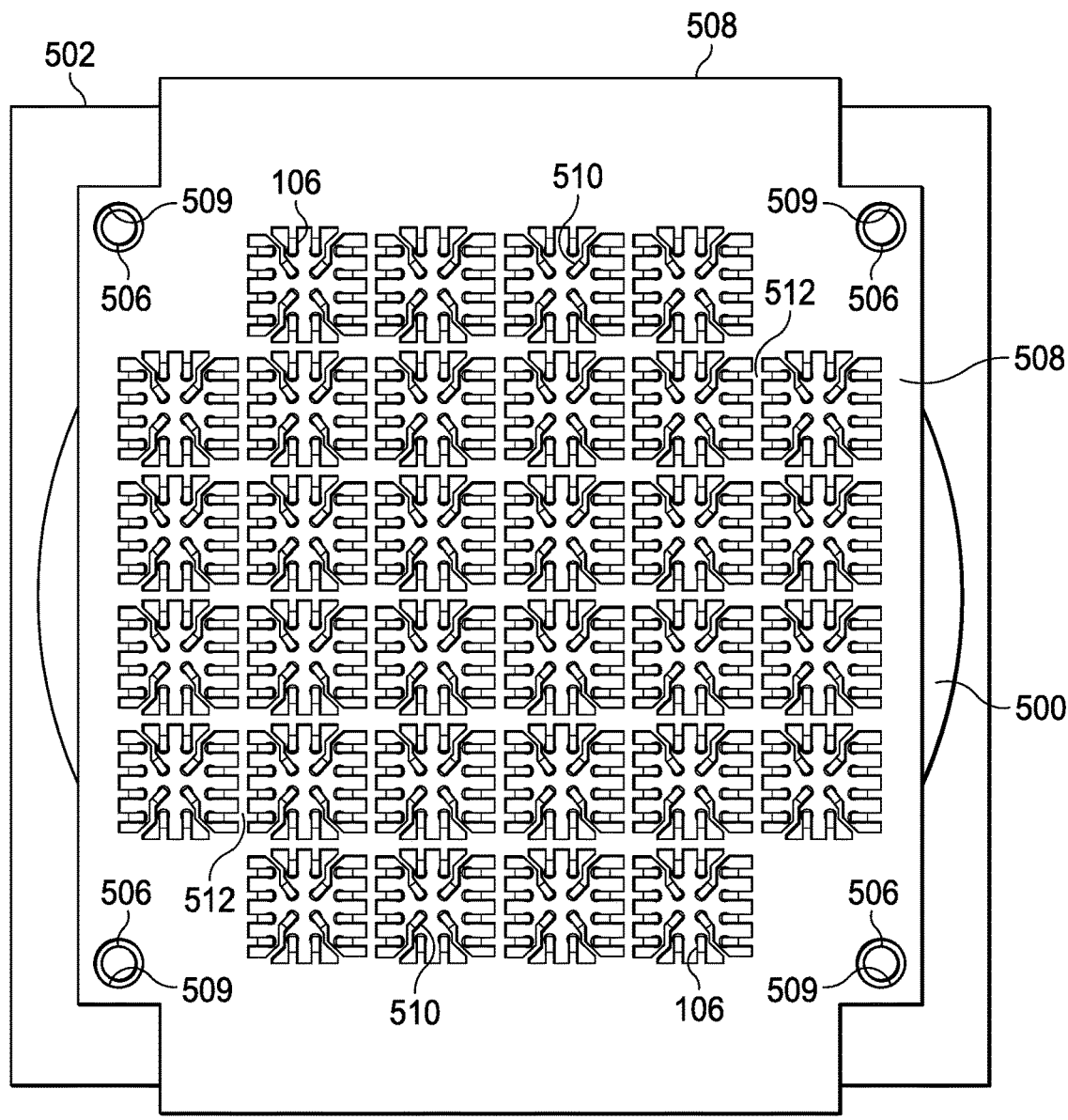
FIG. 5E1
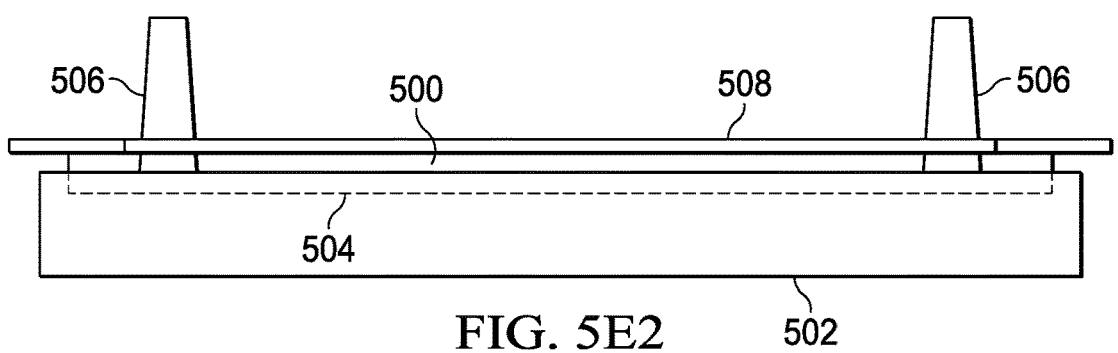
FIG. 5E2

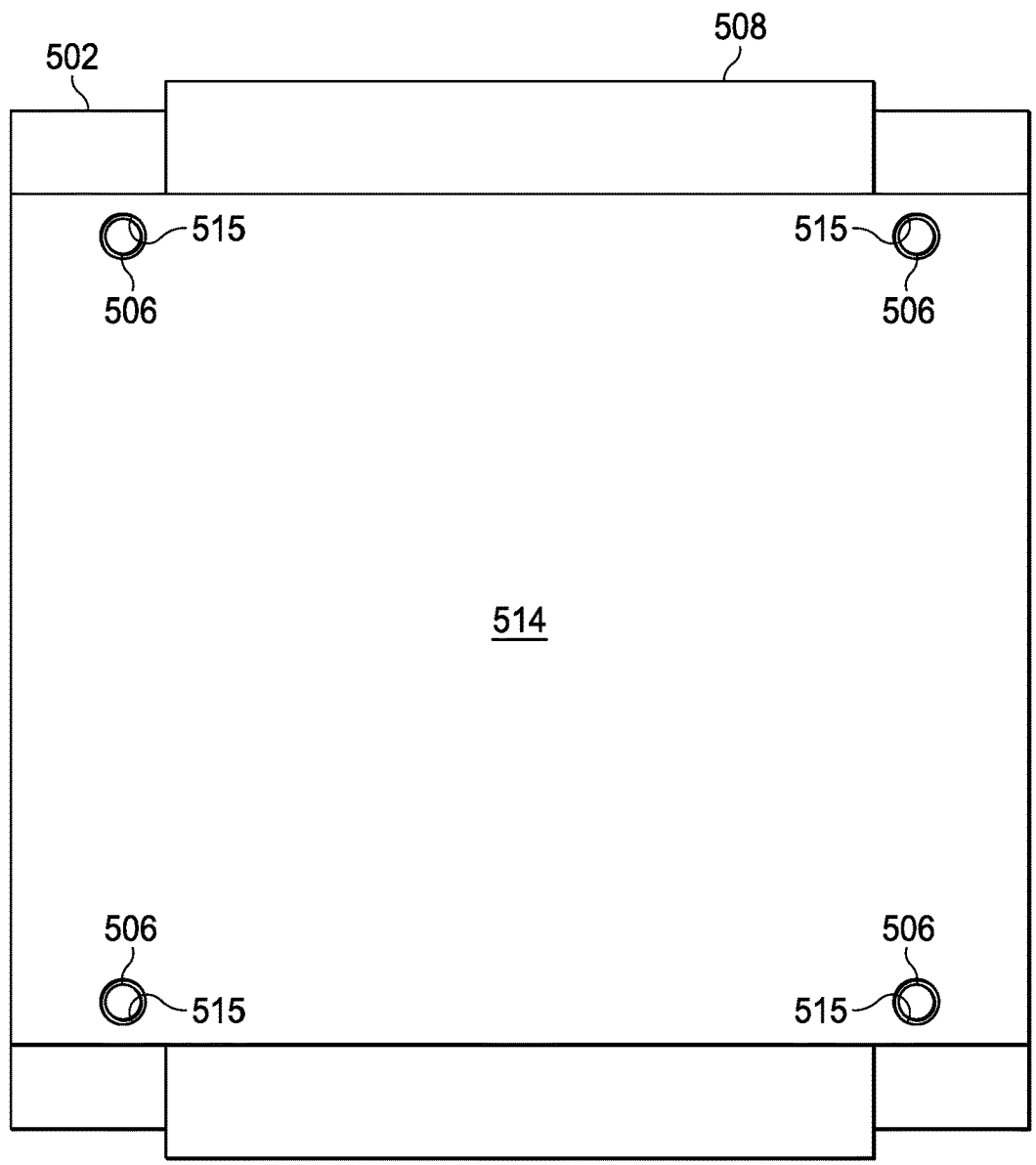
FIG. 5F1
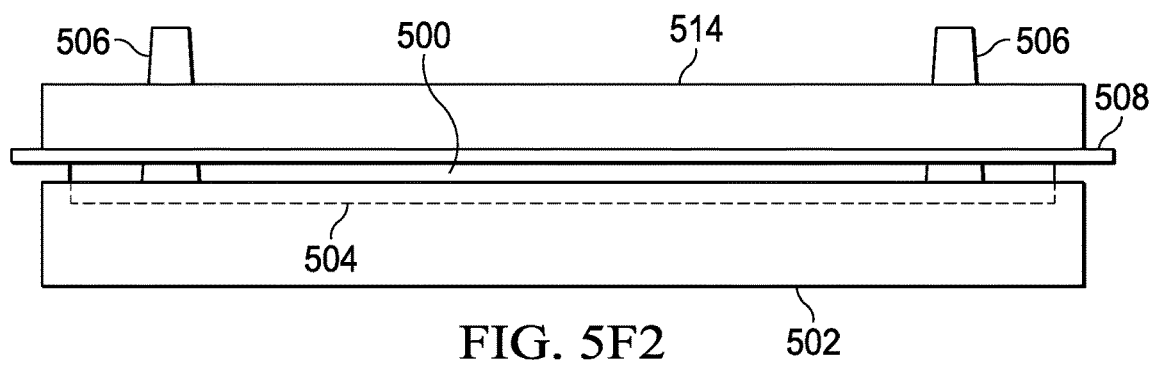
FIG. 5F2

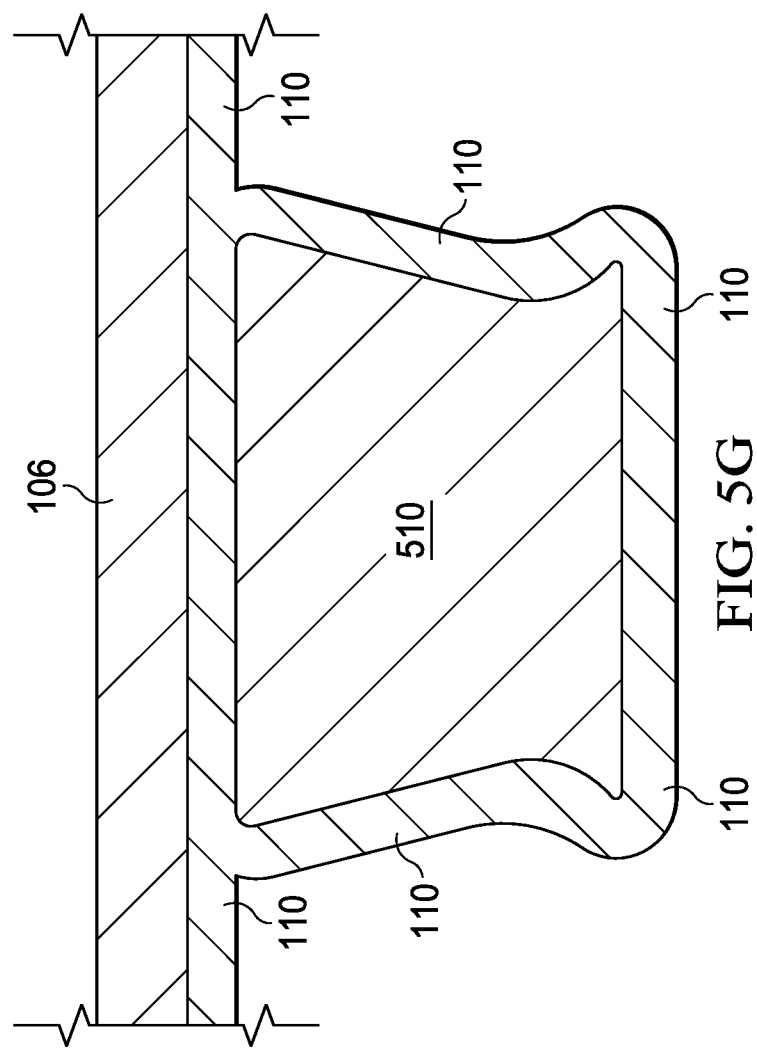

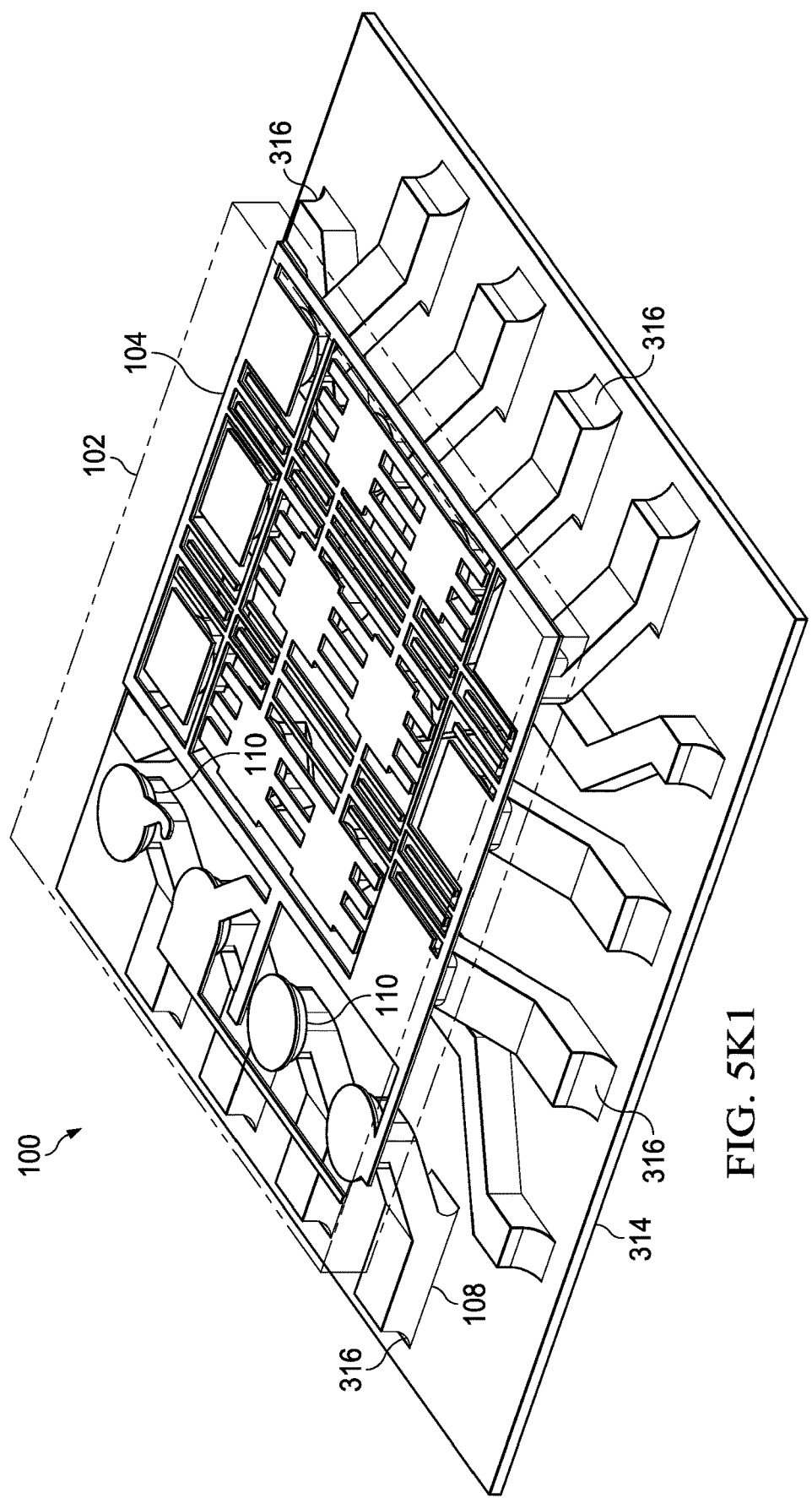
FIG. 5K1

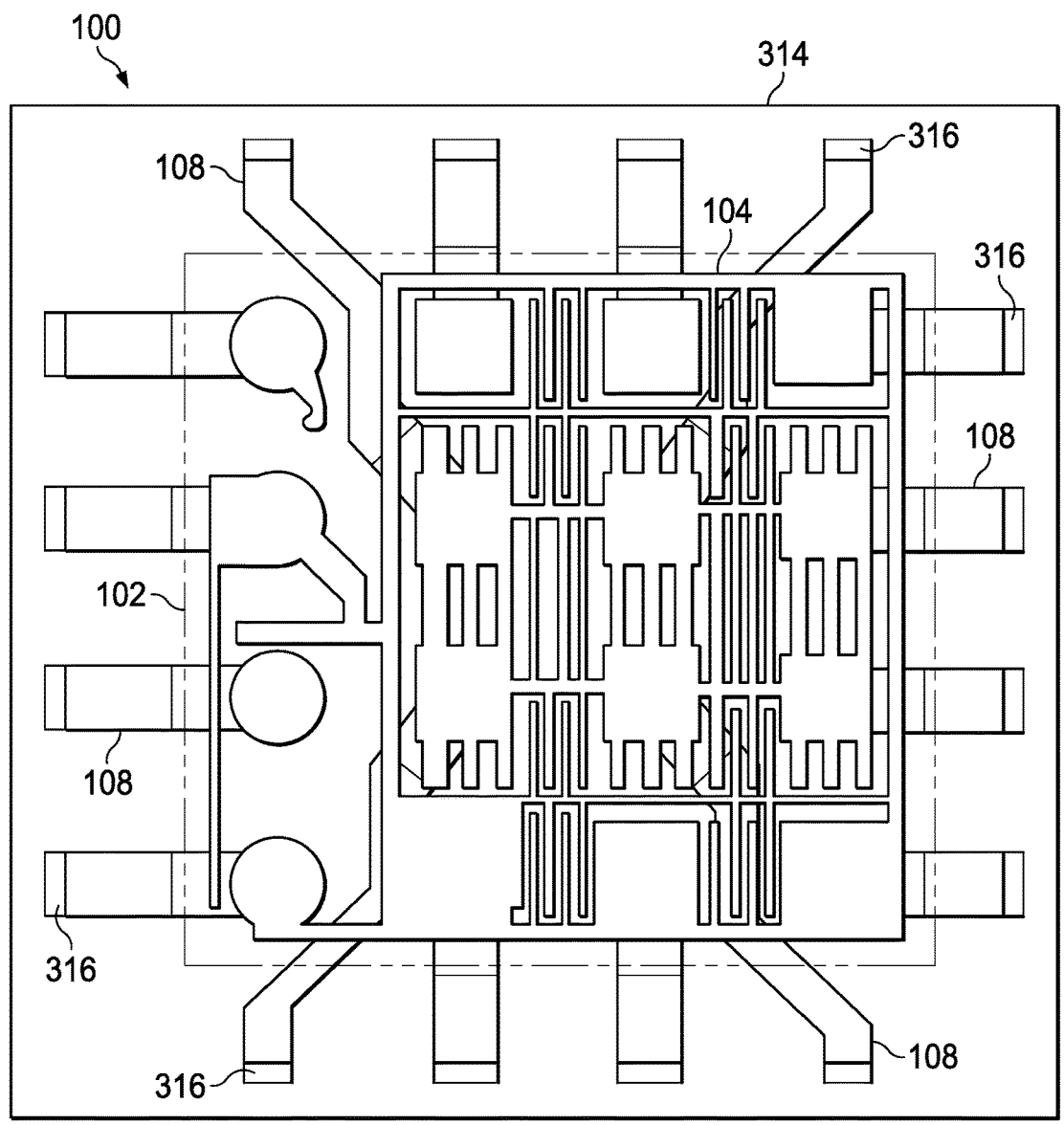
FIG. 5K2
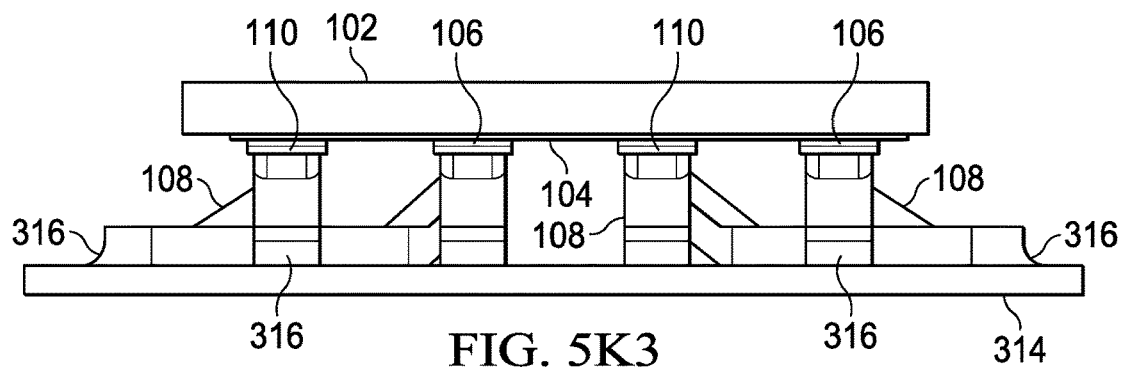
FIG. 5K3

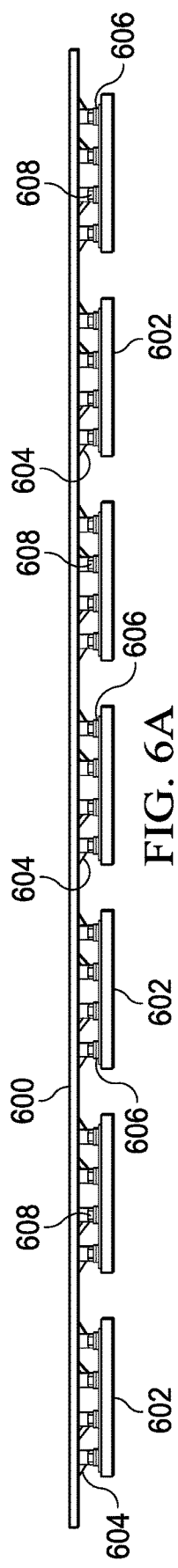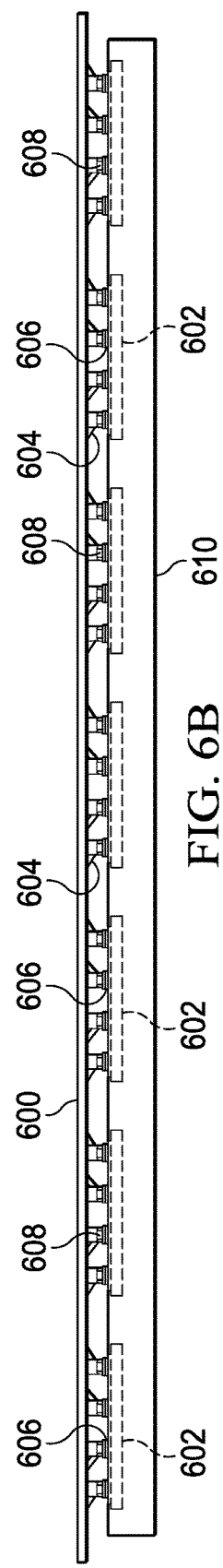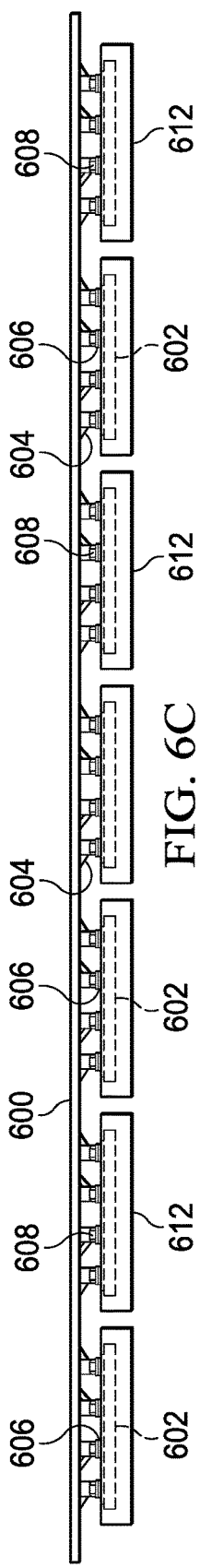

LEADED WAFER CHIP SCALE PACKAGES

BACKGROUND

Semiconductor chips are often housed inside semiconductor packages that protect the chips from deleterious environmental influences, such as heat, moisture, and debris. A packaged chip communicates with electronic devices outside the package via conductive members, such as leads, that are exposed to surfaces of the package. Within the package, the chip may be electrically coupled to the conductive members using any suitable technique. One such technique is the flip-chip technique, in which the semiconductor chip (also called a "die") is flipped so the device side of the chip (in which circuitry is formed) is facing downward. The device side is coupled to the conductive members using, e.g., solder bumps. Another technique is the wire-bonding technique, in which the device side of the semiconductor chip is oriented upward and is coupled to the conductive members using bond wires.

SUMMARY

In examples, a wafer chip scale package (WCSP) comprises a semiconductor die including a device side having circuitry formed therein. The WCSP includes a redistribution layer (RDL) including an insulation layer abutting the device side and a metal trace coupled to the device side and abutting the insulation layer. The WCSP includes a conductive member coupled to the metal trace, the conductive member in a first vertical plane that is positioned no farther than a quarter of a horizontal width of the semiconductor die from a vertical axis extending through a center of the semiconductor die. The WCSP includes a lead coupled to the conductive member and extending horizontally past a second vertical plane defined by a perimeter of the semiconductor die.

In examples, a method includes positioning a wafer having a wafer chip scale package (WCSP) formed thereon in a cavity of a carrier, the WCSP having an array of conductive members. The method includes aligning leads of a lead frame with the array of conductive members and aligning portions of the lead frame with scribe streets in the wafer. The method includes coupling each of the leads of the lead frame to a respective conductive member of the array of conductive members using a metal. The method includes sawing the wafer along the scribe streets in the wafer and trimming the lead frame, the leads coupled to the array of conductive members of the WCSP, distal ends of the leads extending horizontally beyond a boundary defined by multiple vertical planes of a perimeter of the WCSP.

BRIEF DESCRIPTION OF THE DRAWINGS

For a detailed description of various examples, reference will now be made to the accompanying drawings in which:

FIG. 3A is a front side view of a semiconductor wafer having non-leaded WCSPs, in accordance with various examples.

FIG. 3B is a bottom-up view of a singulated non-leaded WCSP, in accordance with various examples.

FIG. 3C1 is a top-down view of a WCSP carrier having a plurality of cavities, in accordance with various examples.

FIG. 3C2 is a profile view of a WCSP carrier having a plurality of cavities, in accordance with various examples.

FIG. 3D1 is a top-down view of a WCSP carrier having a plurality of cavities filled with non-leaded WCSPs, in accordance with various examples.

FIG. 3D2 is a profile view of a WCSP carrier having a plurality of cavities filled with non-leaded WCSPs, in accordance with various examples.

FIG. 3E1 is a top-down view of a WCSP carrier having a lead frame strip covering a plurality of cavities filled with non-leaded WCSPs, in accordance with various examples.

FIG. 3E2 is a profile view of a WCSP carrier having a lead frame strip covering a plurality of cavities filled with non-leaded WCSPs, in accordance with various examples.

FIG. 3F1 is a top-down view of a WCSP carrier having a clamp tool abutting a lead frame strip covering a plurality of cavities filled with non-leaded WCSPs, in accordance with various examples.

FIG. 3F2 is a profile view of a WCSP carrier having a clamp tool abutting a lead frame strip covering a plurality of cavities filled with non-leaded WCSPs, in accordance with various examples.

FIG. 3G is a cross-sectional view of a lead of a lead frame coupled to a conductive member of a WCSP, in accordance with various examples.

FIG. 3L1 is a perspective view of a leaded WCSP coupled to a substrate, in accordance with various examples.

FIG. 3L2 is a top-down view of a leaded WCSP coupled to a substrate, in accordance with various examples.

FIG. 3L3 is a profile view of a leaded WCSP coupled to a substrate, in accordance with various examples.

FIG. 3M is a block diagram of an electronic device having a leaded WCSP coupled to a substrate, in accordance with various examples.

FIG. 4 is a flow diagram of a method for manufacturing a leaded WCSP, in accordance with various examples.

FIG. 5C1 is a top-down view of a WCSP carrier having a wafer cavity, in accordance with various examples.

FIG. 5C2 is a profile view of a WCSP carrier having a wafer cavity, in accordance with various examples.

FIG. 5D1 is a top-down view of a WCSP carrier having a wafer cavity filled with a wafer having multiple non-leaded WCSPs, in accordance with various examples.

FIG. 5D2 is a profile view of a WCSP carrier having a wafer cavity filled with a wafer having multiple non-leaded WCSPs, in accordance with various examples.

FIG. 5E1 is a top-down view of a WCSP carrier having a lead frame strip covering a wafer cavity filled with a wafer having multiple non-leaded WCSPs, in accordance with various examples.

FIG. 5E2 is a profile view of a WCSP carrier having a lead frame strip covering a wafer cavity filled with a wafer having multiple non-leaded WCSPs, in accordance with various examples.

FIG. 5F 1 is a top-down view of a WCSP carrier having a clamp tool abutting a lead frame strip covering a wafer cavity filled with a wafer having multiple non-leaded WCSPs, in accordance with various examples.

FIG. 5F2 is a profile view of a WCSP carrier having a clamp tool abutting a lead frame strip covering a wafer cavity filled with a wafer having multiple non-leaded WCSPs, in accordance with various examples.

FIG. 5G is a cross-sectional view of a lead of a lead frame coupled to a conductive member of a WCSP, in accordance with various examples.

FIG. 5K1 is a perspective view of a leaded WCSP coupled to a substrate, in accordance with various examples.

FIG. 5K2 is a top-down view of a leaded WCSP coupled to a substrate, in accordance with various examples.

FIG. 5K3 is a profile view of a leaded WCSP coupled to a substrate, in accordance with various examples.

FIGS. 6A-6C depict a process flow for insulating a plurality of leaded WCSPs, in accordance with various examples.

DETAILED DESCRIPTION

Certain types of semiconductor packages, such as wafer chip scale packages (WCSP), are advantageous because they enable increased design flexibility, reduced manufacturing costs, and reduced overall size relative to traditional leaded packages, such as dual inline packages (e.g., with gullwing style leads). For at least these reasons, such packages are favored and frequently used in various industries, including the automotive industry. Unlike leaded packages, however, WCSPs and similar packages include conductive members whose solder joint connections to a substrate are difficult to view, and, thus, are difficult to validate during quality control testing. For example, a WCSP having an array of conductive members (e.g., a ball grid array) on a bottom surface of the WCSP may be connected to a substrate using solder, but verifying the integrity of such connections is challenging. Traditional leaded packages could be used to mitigate this challenge, but, as described above, the traditional leaded package introduces increased cost, size, and design complexity.

This disclosure describes various examples of leaded WCSPs. In particular, the examples described herein include leaded WCSPs having a semiconductor die, a redistribution layer (RDL) coupled to the device side of the semiconductor die, and an array of conductive members, such as copper posts, coupled to the RDL. The leaded WCSPs further include an array of leads obtained from a lead frame, with each lead coupled to a different conductive member in the array of conductive members. Each lead has a proximal end and a distal end. The proximal end is coupled to a conductive member of the leaded WCSP using a plated metal (e.g., nickel) or a sintered metal. The distal end extends horizontally past a boundary defined by the vertical planes of the perimeter of the semiconductor die. In a top-down view, the distal ends of the various leads extend out from under the perimeter of the semiconductor die and are thus visible. Because the distal ends are visible, solder joints coupling the distal ends to a substrate are also visible for quality control purposes.

Figure 1A:
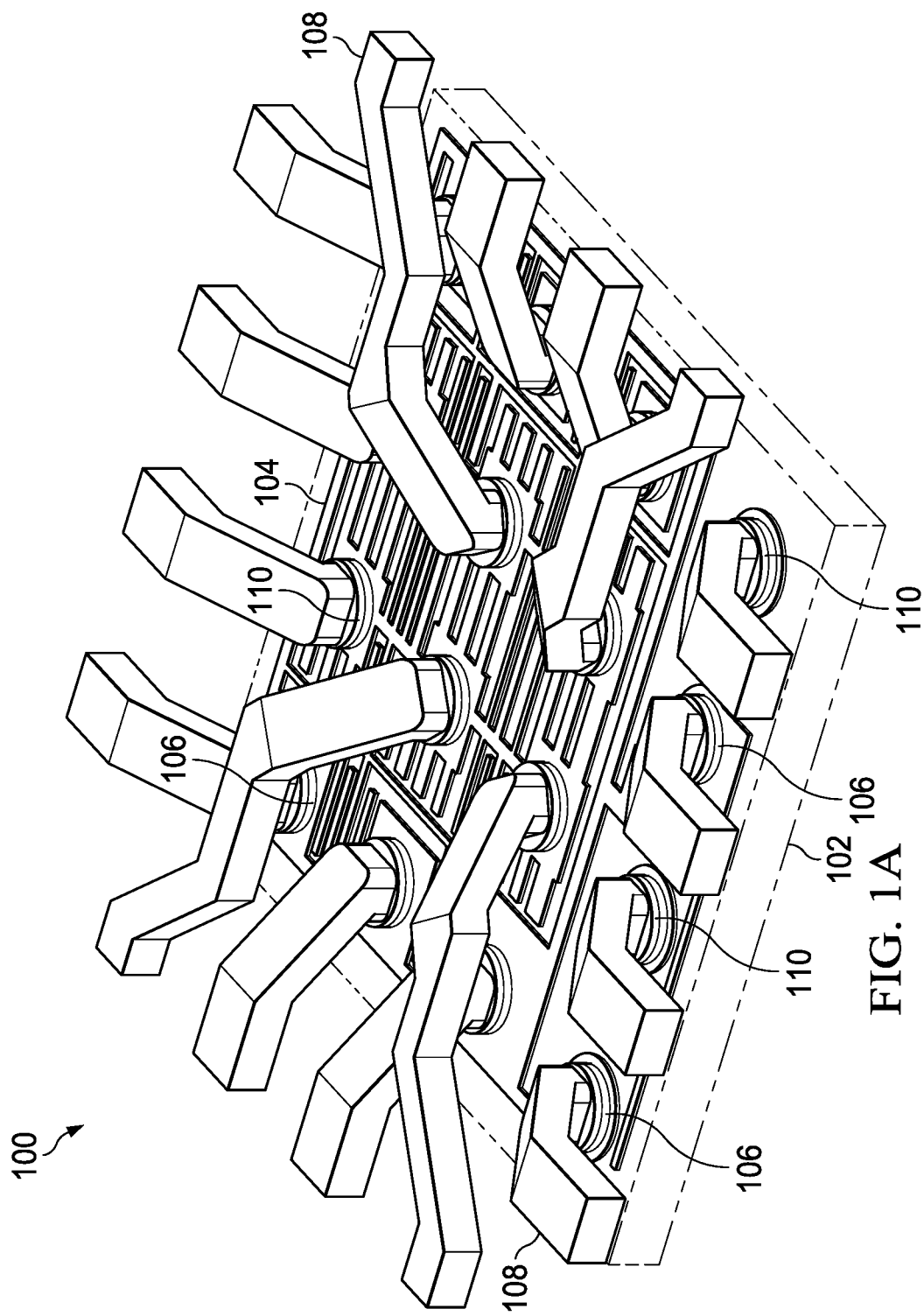
FIG. 1A is a perspective view of a leaded wafer chip scale package (WCSP), in accordance with various examples.
Figure 1B:
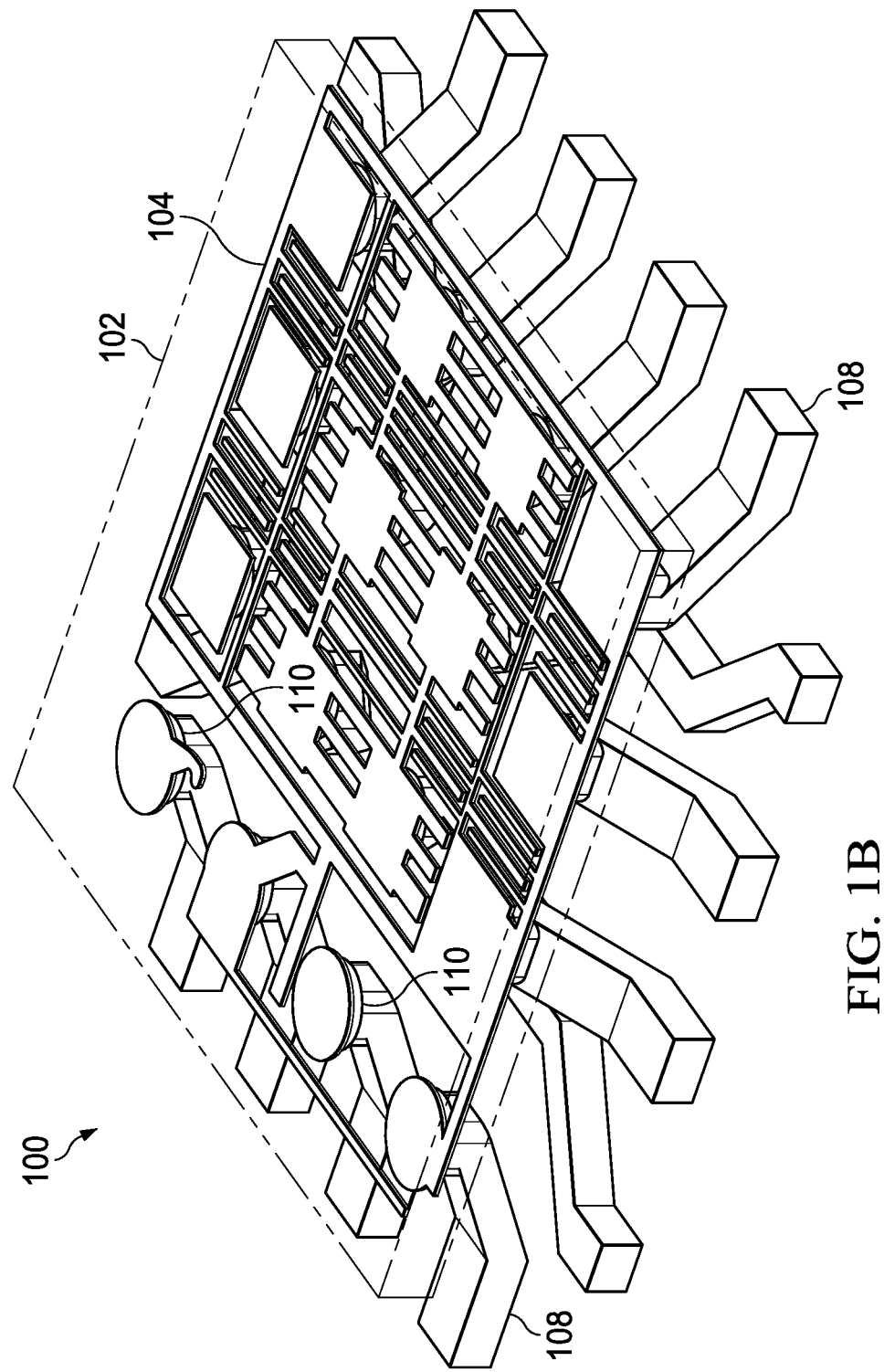
FIG. 1B is a perspective view of a leaded WCSP, in accordance with various examples.
Figure 1C:
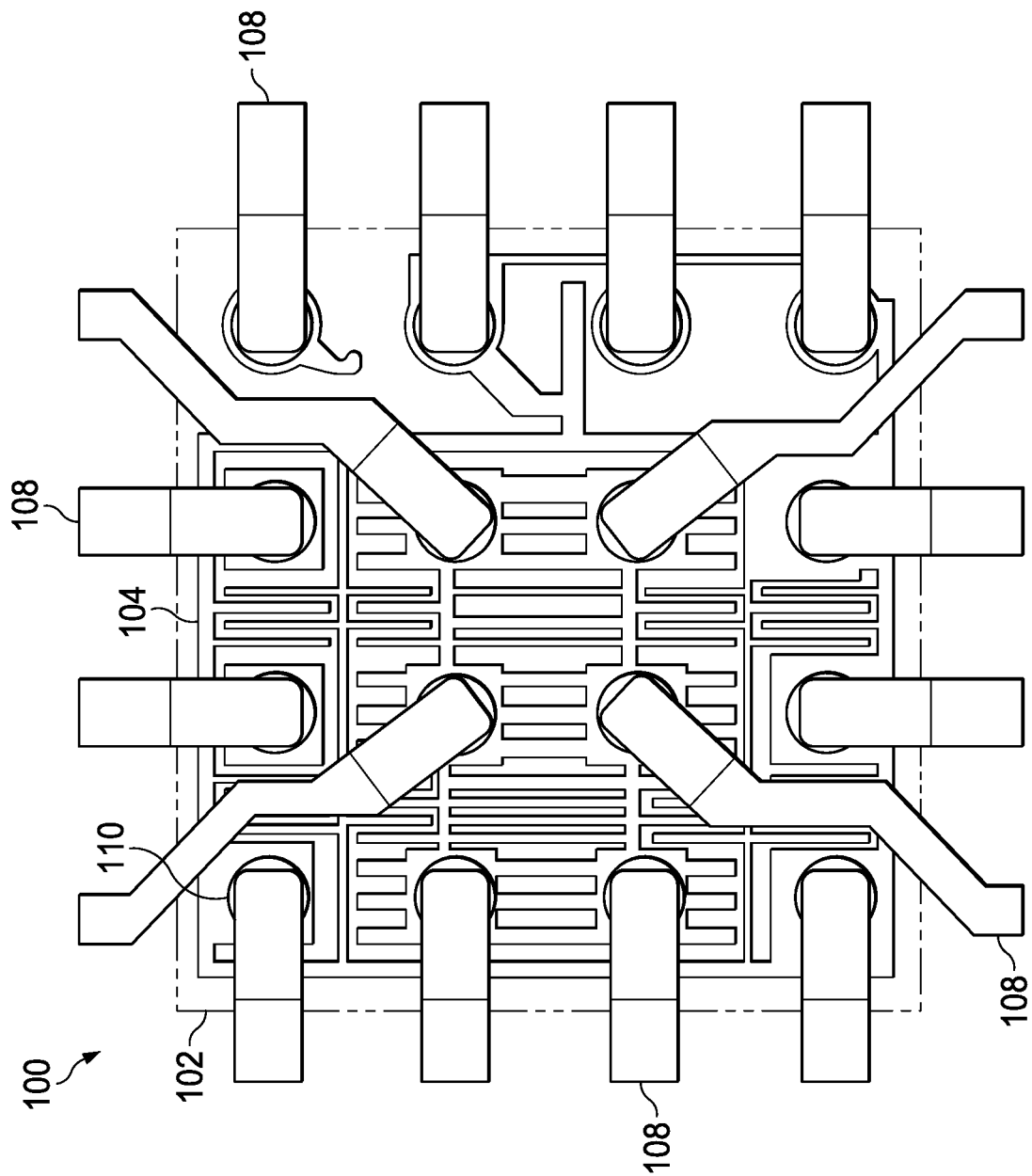
FIG. 1C is a bottom-up view of a leaded WCSP, in accordance with various examples.
Figure 1D:
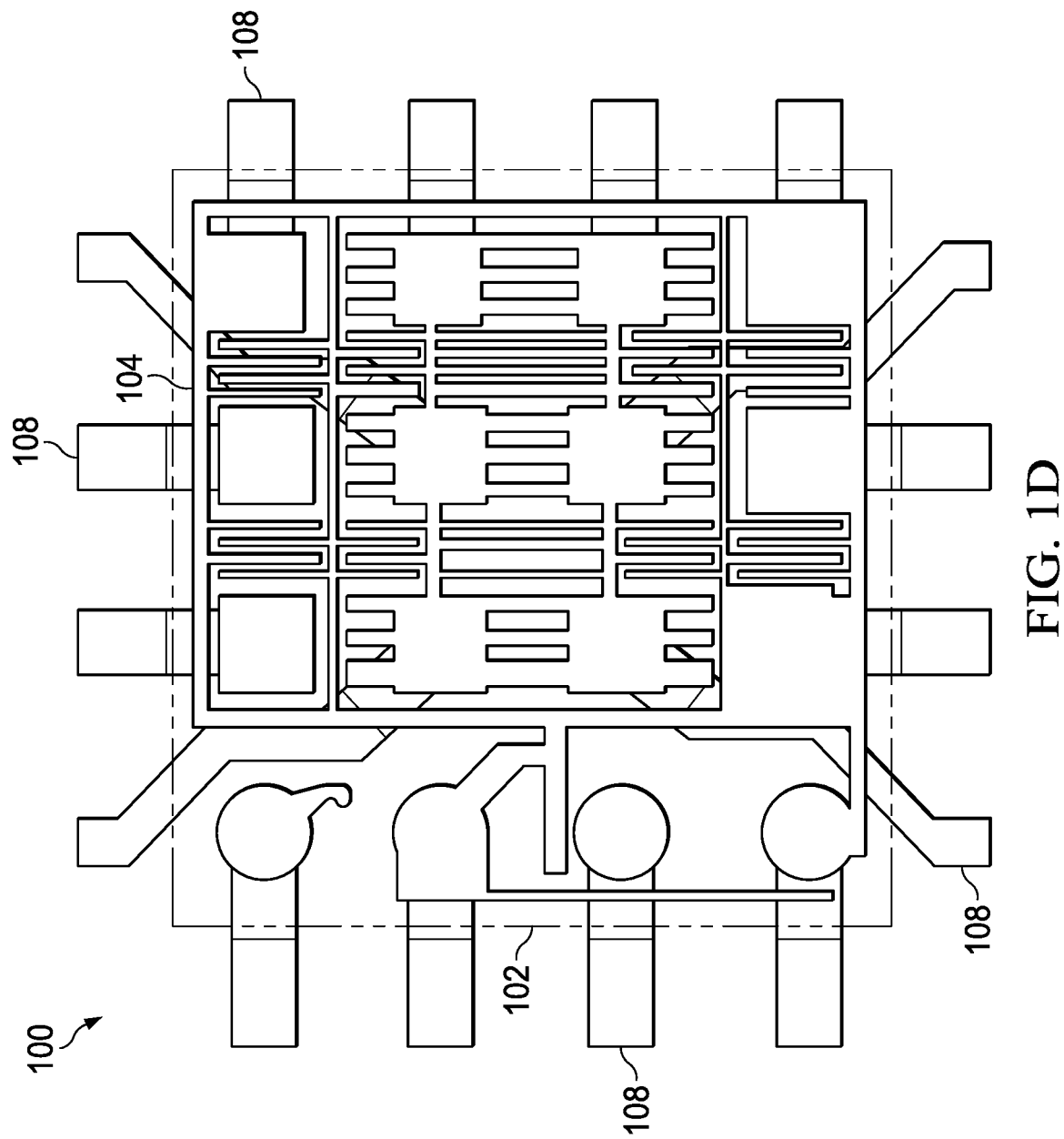
FIG. 1D is a top-down view of a leaded WCSP, in accordance with various examples.

FIG. 1A is a perspective view of a leaded wafer chip scale package (WCSP) 100, in accordance with various examples. The leaded WCSP 100 includes a semiconductor die 102 and a redistribution layer (RDL) 104 on the semiconductor die 102. The RDL 104 abuts a device side of the semiconductor die 102 in which circuitry is formed. The RDL 104 may include an insulation layer, such as a polyimide layer, and conductive traces (e.g., copper traces) that are insulated from each other by the insulation layer. The leaded WCSP 100 includes conductive members 106, such as copper posts or pillars, that are coupled to the RDL 104. The conductive members 106 are thus electrically coupled to circuitry formed in the device side of the semiconductor die 102. The leaded WCSP 100 further includes leads 108 that do not contact each other and that are coupled to the conductive members 106. The leads 108 are coupled to some or all of the conductive members 106, including the conductive members 106 that are in vertical planes positioned no farther than a quarter of a horizontal width of the semiconductor die 102 from a vertical axis extending through a center of the semiconductor die 102. The leads 108 are coupled to the conductive members 106 by way of a metal connection 110. In examples, the metal connection 110 is a plated metal, such as an electroplated metal (e.g., plated nickel). In examples, the metal connection is a sintered metal, such as copper, aluminum, or nickel. Nickel in particular is advantageous because of its ability to withstand high levels of heat (e.g., 300 degrees Celsius or more), such as when curing processes are performed later in the fabrication process. A perimeter of the semiconductor die 102 coincides with four vertical planes that form a boundary beyond which the leads 108 extend in a horizontal direction, as shown. The extent to which each of the leads 108 extends beyond the boundary is at least 1 micron. An extension of the lead 108 beyond the boundary that falls below this range is disadvantageous because it inhibits a clear view of solder joints that may be formed at the distal ends of the leads 108, for example, to couple the leads 108 to a substrate (e.g., a printed circuit board, an organic substrate, a lead frame). Absent a clear view of such solder joints, quality control measures cannot be effectively implemented. FIG. 1B is another perspective view of the leaded WCSP 100, in accordance with various examples. FIG. 1C is a bottom-up view of the leaded WCSP 100, in accordance with various examples. FIG. 1D is a top-down view of the leaded WCSP 100, in accordance with various examples.

Figure 2:
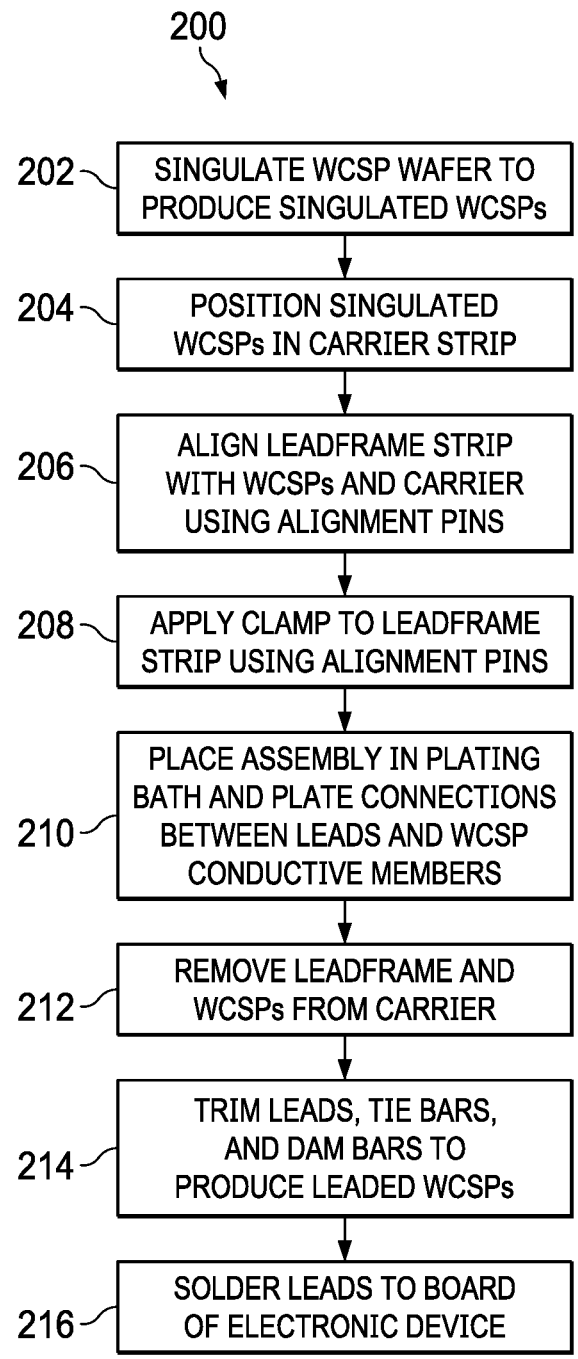
FIG. 2 is a flow diagram of a method for manufacturing a leaded WCSP, in accordance with various examples.

FIG. 2 is a flow diagram of a method 200 for manufacturing a leaded WCSP, such as the leaded WCSP 100, in accordance with various examples. FIGS. 3A-3M are a process flow for manufacturing a leaded WCSP, such as the leaded WCSP 100, in accordance with various examples. Accordingly, FIG. 2 and FIGS. 3A-3M are now described in parallel.

The method 200 begins with singulating a WCSP wafer to produce a singulated, non-leaded WCSP (202). A WCSP wafer is a semiconductor wafer (e.g., silicon wafer) in which circuitry is formed on unsingulated semiconductor dies, RDLs are formed on the circuitry, and conductive members (e.g., copper posts or pillars) are formed on the RDLs, thereby producing multiple unsingulated, non-leaded WCSPs. For example, FIG. 3A is a front side view of a semiconductor wafer 300 having unsingulated, non-leaded WCSPs 301, in accordance with various examples. The wafer 300 may be singulated to produce singulated, non-leaded WCSPs. As FIG. 3B shows in a bottom-up view of a singulated, non-leaded WCSP 301, multiple conductive members 106 form a ball grid array on an RDL 104 of the non-leaded WCSP 301.

The method 200 further includes positioning the singulated, non-leaded WCSPs in a WCSP carrier (204). FIG. 3C1 is a top-down view of a WCSP carrier 303 having a plurality of cavities 302, in accordance with various examples. The WCSP carrier 303 includes alignment pins 304 that facilitate the alignment of components, such as lead frame strips and clamps, with cavities 302 and components within the cavities 302. FIG. 3C2 is a profile view of the structure of FIG. 3C1.

FIG. 3D1 is a top-down view of the WCSP carrier 303, in accordance with various examples. The WCSP carrier 303 includes multiple non-leaded WCSPs 301 positioned within the cavities 302, with the conductive members 106 facing away from the carrier 303. FIG. 3D2 is a profile view of the structure of FIG. 3D1.

The method 200 includes aligning a lead frame strip with non-leaded WCSPs and the carrier using alignment pins (206). FIG. 3E1 is a top-down view of the structure of FIG. 3D1, but with the addition of a lead frame strip 306 coupled to the carrier 303. More specifically, the lead frame strip 306 (e.g., a copper lead frame strip) includes orifices 307 through which the alignment pins 304 extend. The alignment pins 304 enable the lead frame strip 306 to be precisely aligned with the non-leaded WCSPs 301 in the cavities 302. More particularly, the alignment pins 304 enable leads 108 of the lead frame strip 306 to precisely align with conductive members 106 on the non-leaded WCSPs 301. The thickness of the lead frame strip 306, the heights of the conductive members 106, the thicknesses of the leads 108, and/or the angles at which the leads 108 extend may be controlled to produce a gap between each lead 108 and a respective conductive member 106 ranging from 0 microns to 50 microns. Subsequent electroplating or sintering processes, as described below, may bridge this gap, thereby coupling each lead 108 and a respective conductive member 106. The electroplated or sintered metal may have a width or thickness equivalent to the width of the gap. A gap between each lead 108 and a respective conductive member 106 wider than the aforementioned range is disadvantageous because plating processes may not be able to form a strong connection, or any connection at all. The lead frame strip 306 includes dam bars 308 between individual lead frames, as shown. FIG. 3E2 is a profile view of the structure of FIG. 3E1.

The method 200 includes the application of a clamp to a lead frame strip using alignment pins (208). FIG. 3F1 is a top-down view of the structure of FIG. 3E1, but with the addition of a clamp tool 312. The clamp tool 312 includes orifices 313 through which the alignment pins 304 extend. When one or more clips (not expressly shown) are applied to the clamp tool 312 and carrier 303 to cause the clamp tool 312 and carrier 303 to move closer together, the clamp tool 312 causes the lead frame strip 306 to be securely held in place with respect to the conductive members 106, so that when the assembly of FIG. 3F1 is later immersed in a plating bath, or when a sintering process is subsequently performed, the leads 108 and the conductive members 106 are properly aligned to achieve coupling therebetween. In addition to the factors described above, the action of the clamp tool 312 may affect the width of the gap between each lead 108 and a respective conductive member 106. The force applied by the clamp tool 312 ranges from 1 kilogram force per square centimeter (1 kgf/cm$^2$) to 10 kgf/cm$^2$ so that the components to be connected via a subsequent plating process are held in proper alignment and within an appropriate distance from each other, with a force less than this range being disadvantageous because it results in poor electroplating connections, and with a force greater than this range being disadvantageous because it will damage the components being pressed together, such as the various WCSPs 301.

The method 200 comprises placing the carrier assembly in a plating bath and plating metal connections between each lead 108 and a respective conductive member 106 (210). FIG. 3G is a cross-sectional view of a lead 108 coupled to a conductive member 106 of a leaded WCSP by way of a plated metal connection 110 (e.g., nickel), in accordance with various examples. In some examples, metal connection 110 includes a sintered metal. The gap between each lead 108 and the respective conductive member 106 that is filled by the plated metal connection 110 ranges from 0 microns to 50 microns, as described above, with a gap greater than this range introducing a risk of a poor-quality plating or sintering connection.

Figure 3H:
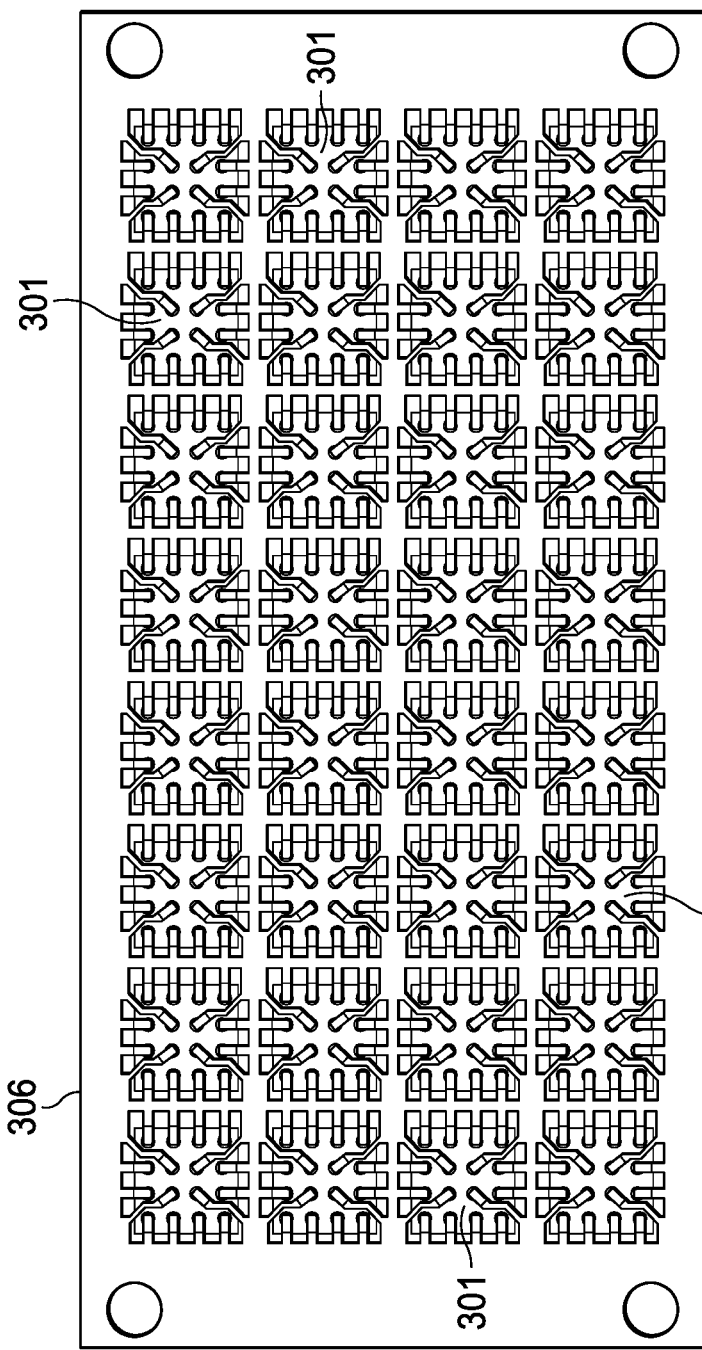
FIG. 3H is a top-down view of a lead frame strip coupled to an array of leaded WCSPs, in accordance with various examples.
Figure 3I:
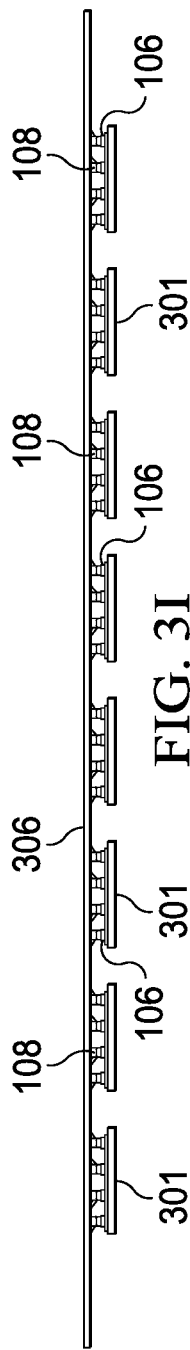
FIG. 3I is a profile view of a lead frame strip coupled to an array of leaded WCSPs, in accordance with various examples.

The method 200 then includes removing the lead frame strip and the WCSPs attached to the lead frame strip from the carrier (212). FIG. 3H is a top-down view of the lead frame strip 306 coupled to an array of WCSPs 301, in accordance with various examples. The lead frame strip 306 is coupled to the WCSPs 301 by way of the plated or sintered metal connections depicted in FIG. 3G and described above. FIG. 3I is a profile view of the lead frame strip 306 coupled to an array of WCSPs 301, in accordance with various examples.

Figure 3J:
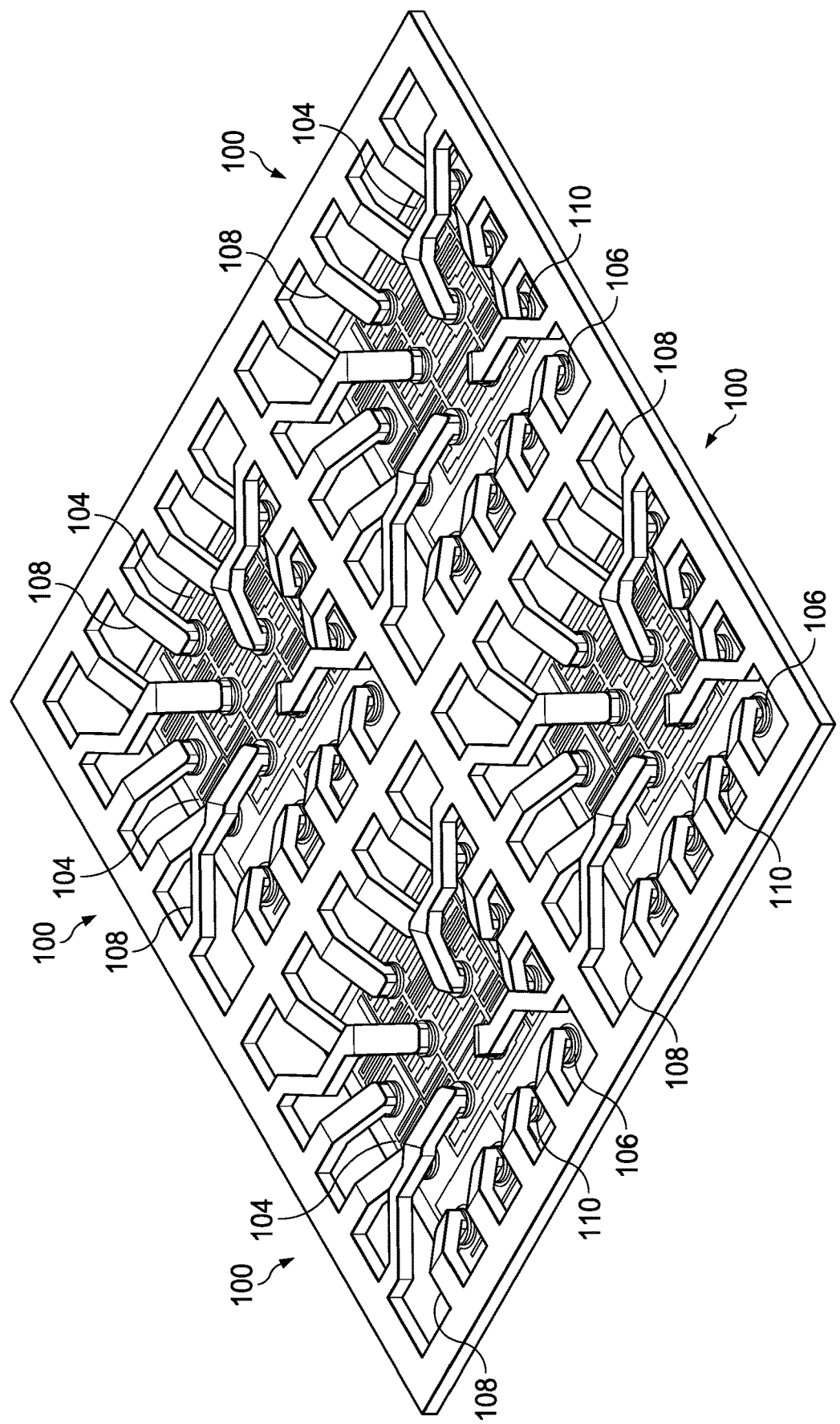
FIG. 3J is a perspective view of a set of lead frames coupled to a set of leaded WCSPs, in accordance with various examples.
Figure 3K:
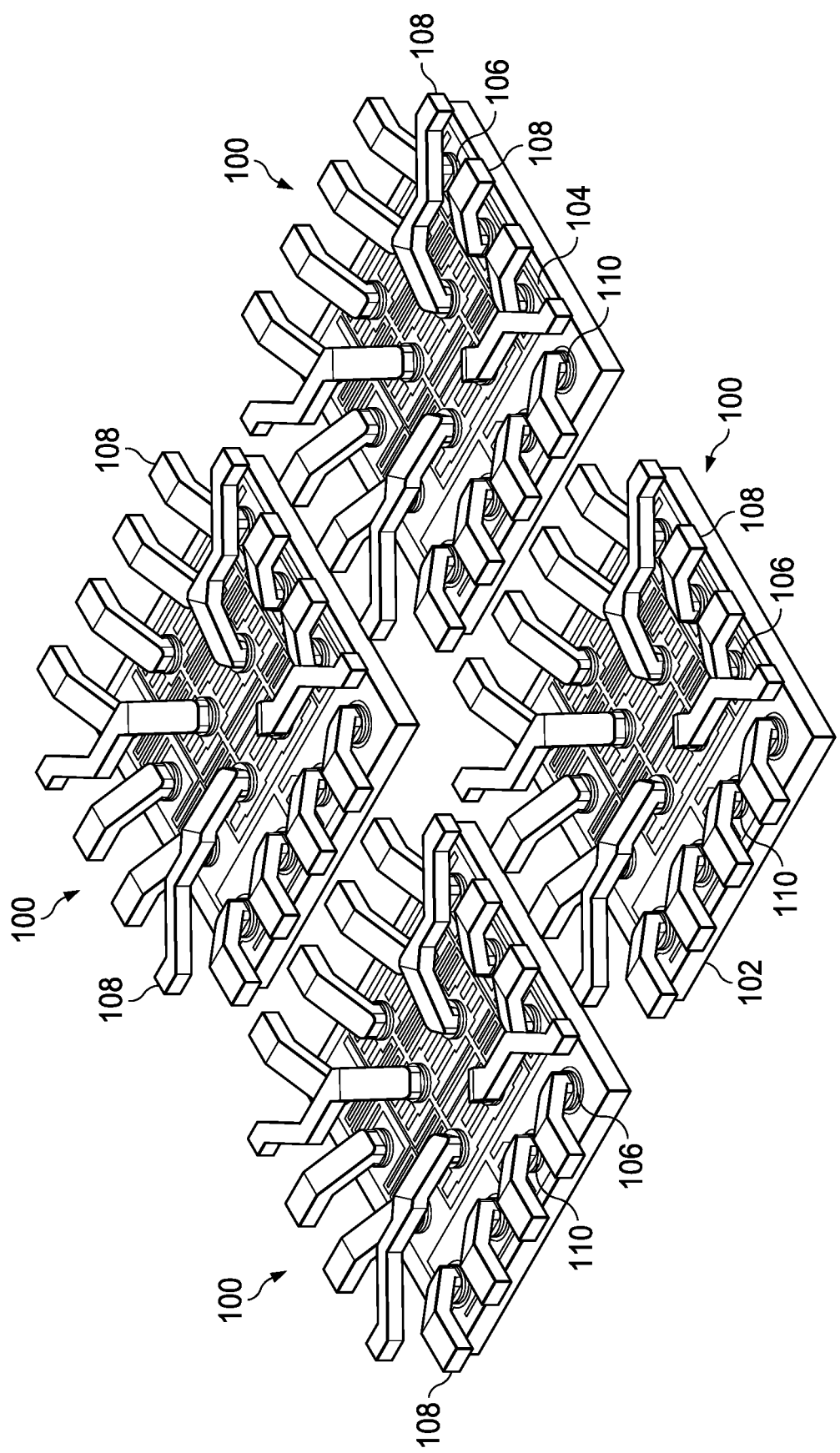
FIG. 3K is a perspective view of a leaded WCSP, in accordance with various examples.

The method 200 includes trimming leads, dam bars, and/or tie bars of the lead frame strip as appropriate to produce singulated, leaded WCSPs (214), and subsequently soldering the leads of the leaded WCSPs to a substrate of an electronic device (216). FIG. 3J is a perspective view of a set of lead frames of the lead frame strip 306 coupled to a set of WCSPs 301, in accordance with various examples. The set of lead frames and the set of WCSPs shown in FIG. 3J are representative of the lead frames and WCSPs included in the lead frame strip 306 and the WCSPs 301 coupled thereto. FIG. 3K is a perspective view of a leaded WCSP 100, in accordance with various examples. FIG. 3L1 is a perspective view of the leaded WCSP 100 coupled to a substrate 314, in accordance with various examples. More specifically, the leaded WCSP 100 is coupled to the substrate 314 by way of solder joints 316 at the distal ends of the leads 108. FIG. 3L2 is a top-down view of the structure of FIG. 3L1, in accordance with various examples. FIG. 3L3 is a profile view of the structure of FIG. 3L1, in accordance with various examples.

FIG. 3M is a block diagram of an electronic device 318 having the leaded WCSP 100 coupled to the substrate 314, in accordance with various examples. In examples, the electronic device 318 may include a personal electronic device (e.g., smartphones, laptop computers, desktop computers, tablets, notebooks, artificial intelligence assistants), an electronic appliance (e.g., refrigerators, microwave ovens, toaster ovens, dishwashers), a networking or enterprise-level electronic device or system (e.g., servers, routers, modems, mainframe computers, wireless access points), an automobile or aviation device or system (e.g., control panels, entertainment devices, navigation devices, power electronics), or any of a variety of other electronic devices or systems.

FIG. 4 is a flow diagram of a method 400 for manufacturing a leaded WCSP, in accordance with various examples. FIGS. 5A-5L are a process flow for manufacturing a leaded WCSP, in accordance with various examples. Thus, FIGS. 4 and 5A-5L are now described in parallel.

Figure 5B:
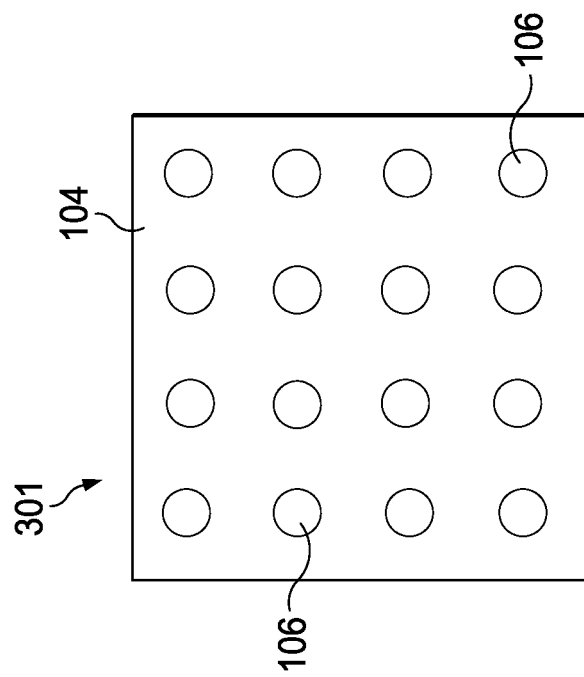
FIG. 5B is a bottom-up view of a singulated non-leaded WCSP, in accordance with various examples.
Figure 5A:
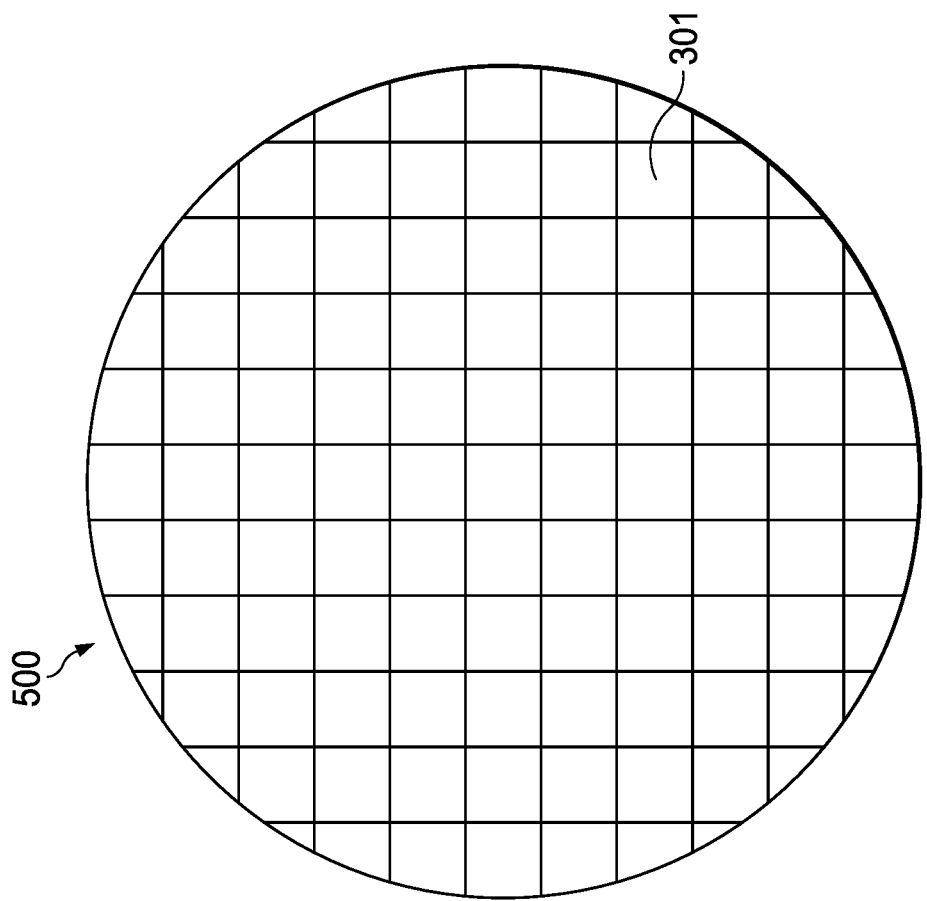
FIG. 5A is a front side view of a semiconductor wafer having non-leaded WCSPs fabricated thereon, in accordance with various examples.

The method 400 includes positioning a WCSP wafer having a plurality of WCSPs on a WCSP carrier (402). FIG. 5A is a front side view of a semiconductor wafer 500 having unsingulated, non-leaded WCSPs 301, in accordance with various examples. As FIG. 5B shows, multiple conductive members 106 form a ball grid array on an RDL 104 of a non-leaded WCSP 301. FIG. 5C1 is a top-down view of a WCSP carrier 502 having a cavity 504 and multiple alignment pins 506. FIG. 5C2 is a profile view of the structure of FIG. 5C1. FIG. 5D1 depicts the structure of FIG. 5C1, but with the addition of the WCSP wafer 500 in the cavity 504. FIG. 5D2 is a profile view of the structure of FIG. 5D1.

The method 400 further includes aligning a lead frame strip with the WCSP wafer and the WCSP carrier using alignment pins (404). FIG. 5E1 depicts the structure of FIG. 5D1, but with the addition of a lead frame strip 508 to the WCSP carrier using the alignment pins 506, which extend through orifices 509. The lead frame strip 508 includes leads 510 and dam bars 512. The alignment pins 506 facilitate alignment of the leads 510 with the conductive members 106, as shown. The thickness of the lead frame strip 508, the heights of the conductive members 106, the thicknesses of the leads 510, and/or the angles at which the leads 510 extend may be controlled to produce a gap between each lead 510 and a respective conductive member 106 ranging from 0 microns to 50 microns. Subsequent electroplating or sintering processes, as described below, may bridge this gap, thereby coupling each lead 510 and a respective conductive member 106. A gap between each lead 510 and a respective conductive member 106 wider than the aforementioned range is disadvantageous because proper electrical connections will not be achieved. The lead frame strip 306 includes dam bars 512 between individual lead frames, as shown. FIG. 5E2 is a profile view of the structure of FIG. 5E1.

The method 400 includes applying a clamp to a lead frame strip using alignment pins (406). FIG. 5F1 is a top-down view of the structure of FIG. 5E1, but with the addition of a clamp tool 514. The clamp tool 514 includes orifices 515 through which the alignment pins 506 extend. The clamp tool 514 causes the lead frame strip 508 to be securely held in place with respect to the conductive members 106, so that when the assembly of FIG. 5F1 is later immersed in a plating bath, or when a sintering process is subsequently performed, the leads 510 and the conductive members 106 are properly aligned to achieve coupling therebetween. In addition to the factors described above, the action of the clamp tool 514 (together with one or more clips (not expressly shown), as described above) may affect the width of the gap between each lead 510 and a respective conductive member 106. In examples, the clamp tool 514 applies a force ranging from 1 $kgf/cm^2$ to 10 $kgf/cm^2$ so that the components to be connected via a subsequent plating process are held in proper alignment and within an appropriate distance from each other, with a force less than this range being disadvantageous due to poorly formed electroplating connections, and with a force greater than this range being disadvantageous because it will damage the components being pressed together, such as the WCSP wafer 500. FIG. 5F2 is a profile view of the structure of FIG. 5F1.

The method 400 includes placing the assembly in a plating bath and plating connections between the leads and WCSP conductive members (408). In some examples, a sintering process may be performed in lieu of plating, for example using nickel, aluminum, or copper. FIG. 5G is a cross-sectional view of a lead 510 coupled to a conductive member 106 of a leaded WCSP by way of a plated metal connection 110 (e.g., nickel), in accordance with various examples. In some examples, metal connection 110 includes a sintered metal. The gap between each lead 510 and a respective conductive member 106 ranges from 0 microns to 50 microns, with a gap wider than this range being disadvantageous because of the high risk of poor-quality plating or sintering connections.

Figure 5H:
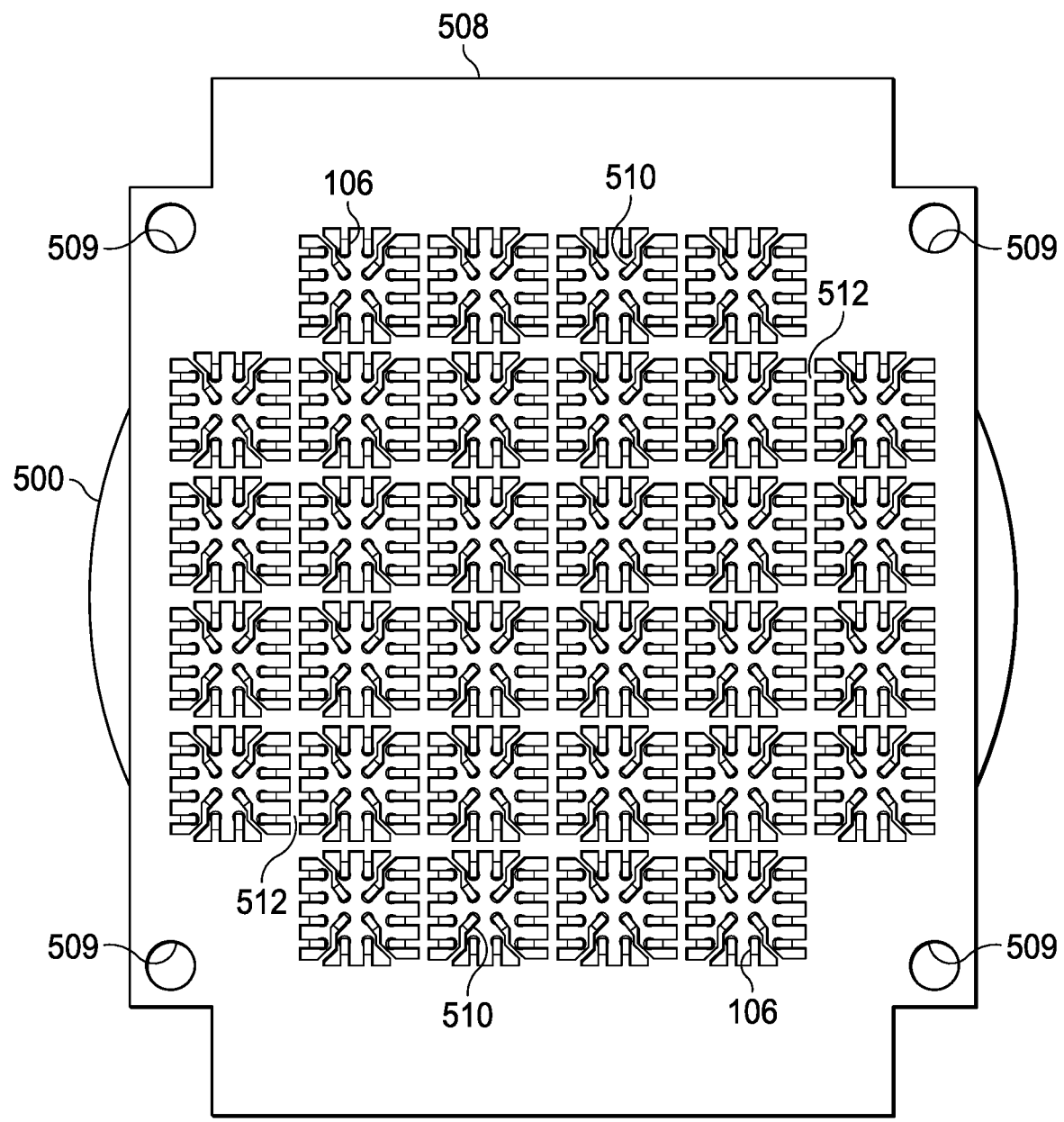
FIG. 5H is a top-down view of a lead frame strip coupled to a wafer having multiple leaded WCSPs, in accordance with various examples.
Figure 5I:
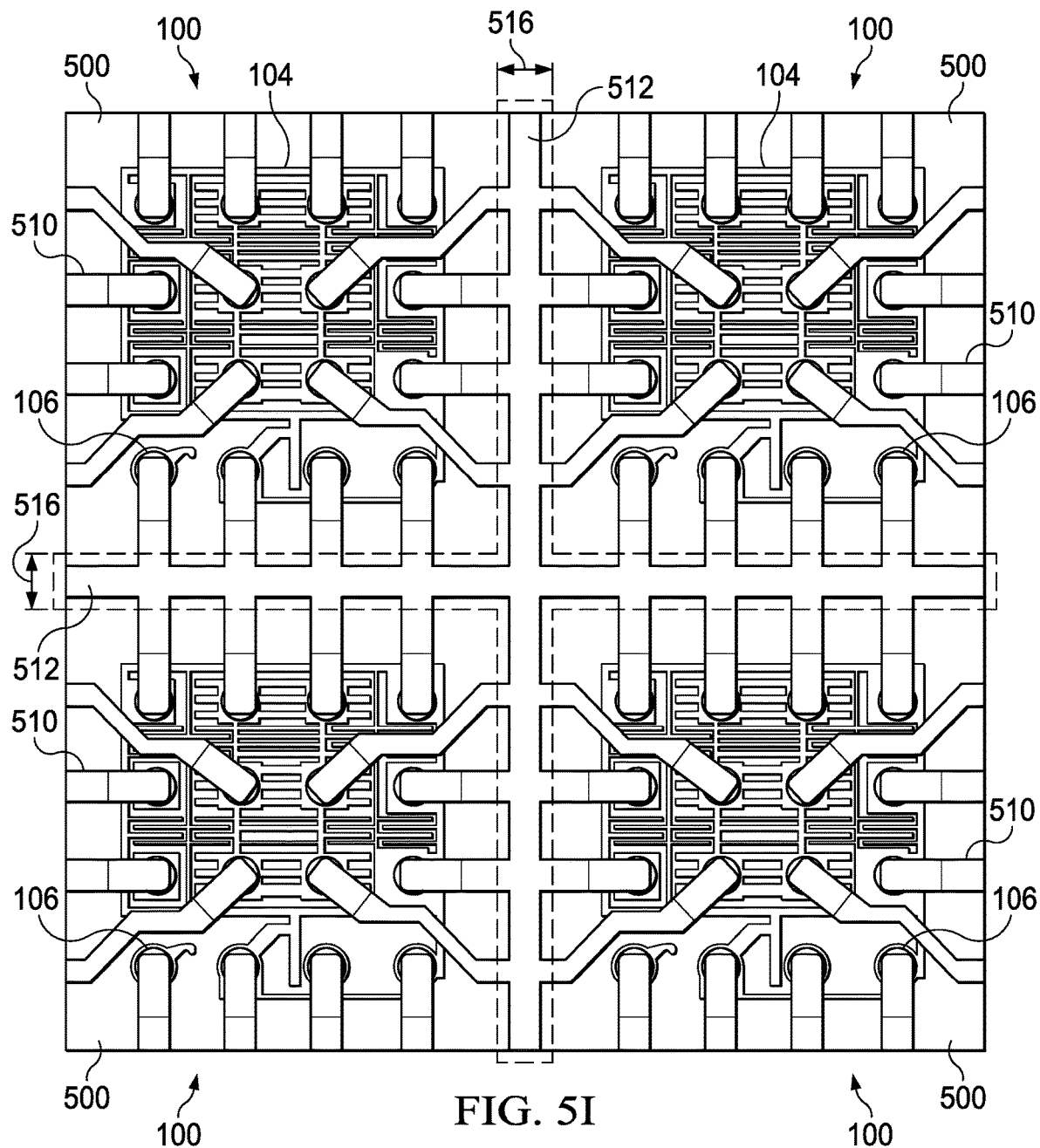
FIG. 5I is a top-down view depicting the sawing of a wafer having multiple leaded WCSPs coupled to a lead frame strip and trimming of the lead frame strip, in accordance with various examples.
Figure 5J:
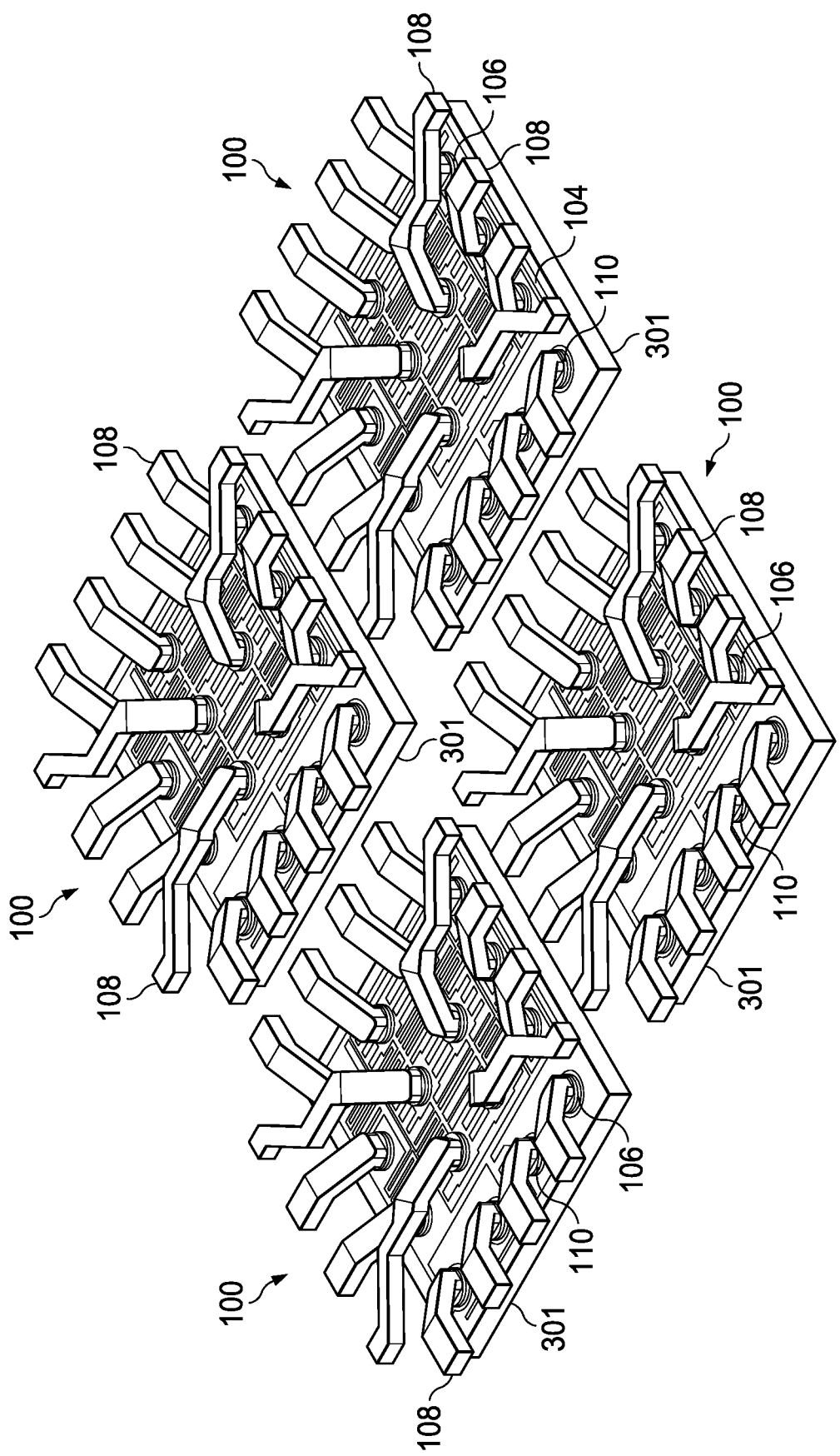
FIG. 5J is a perspective view of a set of lead frames coupled to a set of leaded WCSPs, in accordance with various examples.

The method 400 includes removing the lead frame strip and the WCSP wafer from the WCSP carrier (410), sawing the wafer 500 along its scribe streets, and trimming the lead frame (e.g., dam bars and/or tie bars) (412). FIG. 5H is a top-down view of the lead frame strip 508 coupled to an array of leaded WCSPs 301, in accordance with various examples. The lead frame strip 508 is coupled to the leaded WCSPs 301 by way of the plated or sintered metal connections depicted in FIG. 5G and described above. FIG. 5I is a top-down view depicting the trimming of the lead frame strip 508 (FIG. 5E1) and sawing of the wafer 500 having multiple leaded WCSPs 100 coupled to the lead frame strip 508, in accordance with various examples. Specifically, a saw (e.g., a mechanical or laser saw) may be useful to saw the wafer along scribe streets 516. The dashed lines indicate the boundaries of the wafer scribe streets 516. The lead frame is trimmed as well to separate the leads 510 from each other. The wafer scribe streets 516 must be of a minimum width to accommodate leads 510 of appropriate length, for example, the lengths of the leads 510 described above that facilitate visibility for quality control purposes. To achieve such lengths of the leads 510, the wafer scribe streets 516 have widths of at least 400 microns, with wafer scribe street widths lower than this range being disadvantageous because they do not permit adequate extension of the leads 510 beyond the perimeter of the semiconductor die, and with wafer scribe street widths greater than this range being disadvantageous because they result in excessively long leads 510, waste wafer space, waste electronic device and substrate space, incur unnecessary costs, and compromise desired electrical behavior within the leaded WCSP 100. FIG. 5J is a perspective view of a set of singulated, leaded WCSPs 100, in accordance with various examples.

The method 400 includes soldering leads of the leaded WCSP to the substrate of an electronic device (414). FIG. 5K1 is a perspective view of a leaded WCSP 100 coupled to a substrate 314 using solder joints 316, in accordance with various examples. FIG. 5K2 is a top-down view of the structure of FIG. 5K1, in accordance with various examples. FIG. 5K3 is a profile view of the structure of FIG. 5K1, in accordance with various examples.

Figure 5L:
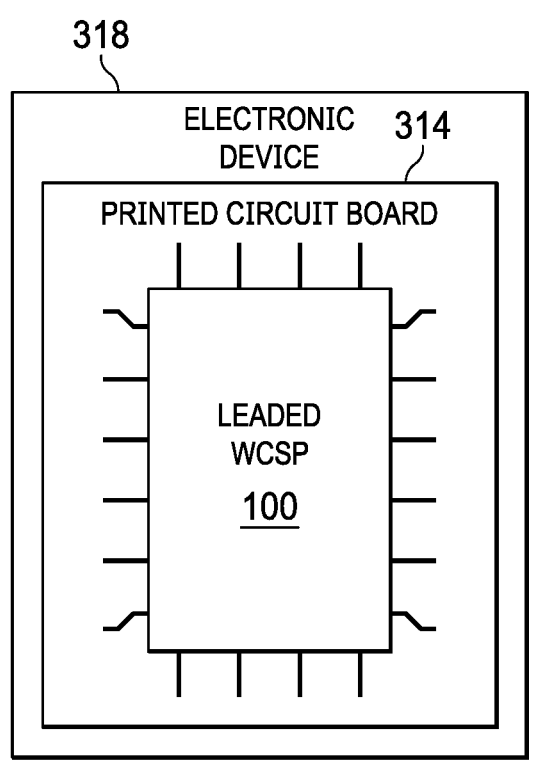
FIG. 5L is a block diagram of an electronic device having a leaded WCSP coupled to a substrate, in accordance with various examples.

FIG. 5L is a block diagram of an electronic device 318 having the leaded WCSP 100 coupled to the substrate 314, in accordance with various examples. In examples, the electronic device 318 may include a personal electronic device (e.g., smartphones, laptop computers, desktop computers, tablets, notebooks, artificial intelligence assistants), an electronic appliance (e.g., refrigerators, microwave ovens, toaster ovens, dishwashers), a networking or enterprise-level electronic device or system (e.g., servers, routers, modems, mainframe computers, wireless access points), an automobile or aviation device or system (e.g., control panels, entertainment devices, navigation devices, power electronics), or any of a variety of other electronic devices or systems.

FIGS. 6A-6C depict a process flow for insulating a plurality of leaded WCSPs, in accordance with various examples. FIG. 6A is a profile view of a lead frame strip 600 having a plurality of leads 604 extending therefrom. The leads 604 are coupled to conductive terminals 606 of leaded WCSPs 602 by way of metal connections 608. For example, the metal connections 608 may include plated metal or sintered metal, as described above. FIG. 6B is a profile view of the structure of FIG. 6A, with the leaded WCSPs 602 dipped in an insulation material 610. For example, the insulation material 610 may include polyimide or epoxy. FIG. 6C is a profile view of the structure of FIG. 6A, but with the leaded WCSPs 602 coated in the insulation material 610. In examples, due to surface tension or the depth to which the assembly is dipped in the insulation material 610, the insulation material 610 may cover one or more of the conductive terminals 606, the metal connections 608, and/or the leads 604.

The term "couple" is used throughout the specification. The term may cover connections, communications, or signal paths that enable a functional relationship consistent with this description. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A. Unless otherwise stated, "about," "approximately," or "substantially" preceding a value means+/−10 percent of the stated value. Modifications are possible in the described examples, and other examples are possible within the scope of the claims.

What is claimed is:

1. A wafer chip scale package (WCSP), comprising:
a semiconductor die including a device side having circuitry formed therein;
a redistribution layer (RDL) including an insulation layer abutting the device side and a metal trace coupled to the device side and abutting the insulation layer;
a conductive member coupled to the metal trace, the conductive member in a first vertical plane that is positioned no farther than a quarter of a horizontal width of the semiconductor die from a vertical axis extending through a center of the semiconductor die; and
a lead coupled to the conductive member, the lead including a distal end that is attachable to a substrate via solder, the distal end extending horizontally past a second vertical plane defined by a perimeter of the semiconductor die.

2. The WCSP of claim 1, wherein the lead is coupled to the conductive member by a nickel plating.

3. The WCSP of claim 1, wherein the lead is coupled to the conductive member by a sintered metal.

4. The WCSP of claim 1, wherein a distal end of the lead extends horizontally past the second vertical plane by at least 1 micron.

5. The WCSP of claim 1, further comprising an insulation material covering the RDL and a non-device side of the semiconductor die opposite the device side, the insulation material also covering the conductive member and a portion of the lead.

6. The WCSP of claim 1, wherein the lead has a proximal end coupled to the conductive member by way of sintered or plated metal, and wherein sintered or plated metal has a thickness of 50 microns or less.

7. An electronic device, comprising:
a substrate; and
a wafer chip scale package (WCSP) coupled to the substrate, the WCSP comprising:
a semiconductor die including a device side having circuitry formed therein;
a redistribution layer (RDL) coupled to the device side;
an array of conductive members coupled to the RDL, the conductive members positioned within a boundary defined by multiple vertical planes of a perimeter of the semiconductor die;
a set of leads coupled to the array of conductive members, each lead in the set of leads electrically isolated from remaining leads in the set of leads and having a distal end extending horizontally past the boundary; and
a set of solder joints coupling the set of leads to the substrate, each solder joint in the set of solder joints having a different vertical axis passing therethrough and not intersecting the semiconductor die.

8. The electronic device of claim 7, wherein a lead in the set of leads is coupled to a respective conductive member of the array of conductive members by a sintered metal.

9. The electronic device of claim 7, wherein a lead in the set of leads is coupled to a respective conductive member of the array of conductive members by a plated metal.

10. The electronic device of claim 9, wherein the plated metal is nickel.

11. The electronic device of claim 9, wherein a gap between a lead in the set of leads and a respective conductive member in the set of conductive members ranges from 0 microns to 50 microns.

12. The electronic device of claim 7, wherein the distal end extends horizontally past the boundary by at least 1 micron.

13. The electronic device of claim 7, further comprising an insulation material covering the RDL and a non-device side of the semiconductor die opposing the device side.

14. A method, comprising:
singulating a semiconductor wafer to produce a wafer chip scale package (WCSP), the WCSP having an array of conductive members;
positioning the WCSP in a cavity of a carrier, the array of conductive members facing away from the carrier;
aligning leads of a lead frame with the array of conductive members;
coupling each of the leads of the lead frame to a respective conductive member of the array of conductive members using a metal; and
trimming the lead frame to separate the leads from the lead frame, the leads coupled to the array of conductive members of the WCSP, distal ends of the leads extending horizontally beyond a boundary defined by multiple vertical planes of a perimeter of the WCSP, wherein the distal ends are attachable to a substrate via solder.

15. The method of claim 14, wherein the metal is a sintered metal.

16. The method of claim 14, wherein the metal is an electroplated metal.

17. The method of claim 14, wherein each of the leads of the lead frame has a proximal end that is coupled to the respective conductive member of the array of conductive members across a gap that ranges in width from 0 microns to 50 microns.

18. The method of claim 14, wherein the distal ends of the leads extend horizontally beyond the boundary by at least 1 micron.

19. A method, comprising:
- positioning a wafer having a wafer chip scale package (WCSP) formed thereon in a cavity of a carrier, the WCSP having an array of conductive members;
- aligning leads of a lead frame with the array of conductive members and aligning portions of the lead frame with scribe streets in the wafer;
- coupling each of the leads of the lead frame to a respective conductive member of the array of conductive members using a metal; and
- sawing the wafer along the scribe streets in the wafer and trimming the lead frame, the leads coupled to the array of conductive members of the WCSP, distal ends of the leads extending horizontally beyond a boundary defined by multiple vertical planes of a perimeter of the WCSP, wherein the distal ends are attachable to a substrate via solder.

20. The method of claim 19, wherein a scribe street of the scribe streets has a width of at least 400 microns.

21. The method of claim 19, wherein the metal is a sintered metal or a plated metal.

22. The method of claim 19, further comprising the distal ends of the leads extending horizontally beyond the boundary by at least 1 micron.

23. The method of claim 19, wherein the leads do not contact each other.

* * * * *